(12) United States Patent
Nagai et al.

(10) Patent No.: US 7,932,579 B2
(45) Date of Patent: Apr. 26, 2011

(54) SEMICONDUCTOR DEVICE AND METHOD FOR MANUFACTURING THE SAME

(75) Inventors: Kouichi Nagai, Kawasaki (JP); Kaoru Saigoh, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 371 days.

(21) Appl. No.: 12/127,902

(22) Filed: May 28, 2008

(65) Prior Publication Data

US 2008/0258260 A1   Oct. 23, 2008

Related U.S. Application Data

(63) Continuation of application No. PCT/JP2005/021810, filed on Nov. 28, 2005.

(51) Int. Cl.
*H01L 21/66* (2006.01)

(52) U.S. Cl. ........... 257/532; 257/E21.008; 257/E21.53; 438/18

(58) Field of Classification Search .................. 257/295, 257/532, 535, 751, 765, 771, E21.008, E21.011, 257/E21.53; 438/18
See application file for complete search history.

(56) References Cited

U.S. PATENT DOCUMENTS

| 5,523,595 | A | * | 6/1996 | Takenaka et al. | 257/295 |
| 5,565,378 | A | * | 10/1996 | Harada et al. | 438/106 |
| 2002/0056862 | A1 | * | 5/2002 | Miki et al. | 257/295 |
| 2004/0188851 | A1 | | 9/2004 | Takewaki et al. | |
| 2005/0002266 | A1 | | 1/2005 | Kanaya et al. | |

FOREIGN PATENT DOCUMENTS

| JP | 11-233542 A | 8/1999 |
| JP | 2004-509479 A | 3/2004 |
| JP | 2004-296621 A | 10/2004 |
| JP | 2004-349474 A | 12/2004 |
| JP | 2005-327962 A | 11/2005 |
| WO | 02/25825 A2 | 3/2002 |

OTHER PUBLICATIONS

International Search Report of PCT/JP2005/021810, date of mailing Mar. 14, 2006.

* cited by examiner

*Primary Examiner* — Victor Mandala
*Assistant Examiner* — Scott Stowe
(74) *Attorney, Agent, or Firm* — Fujitsu Patent Center

(57) ABSTRACT

A semiconductor device including a capacitor formed over a semiconductor substrate and including a lower electrode, a dielectric film formed over the lower electrode and an upper electrode formed over the dielectric film, an insulation film formed over the semiconductor substrate and the capacitor, and an electrode pad formed over the insulation film and including an alloy film of aluminum and magnesium.

18 Claims, 21 Drawing Sheets

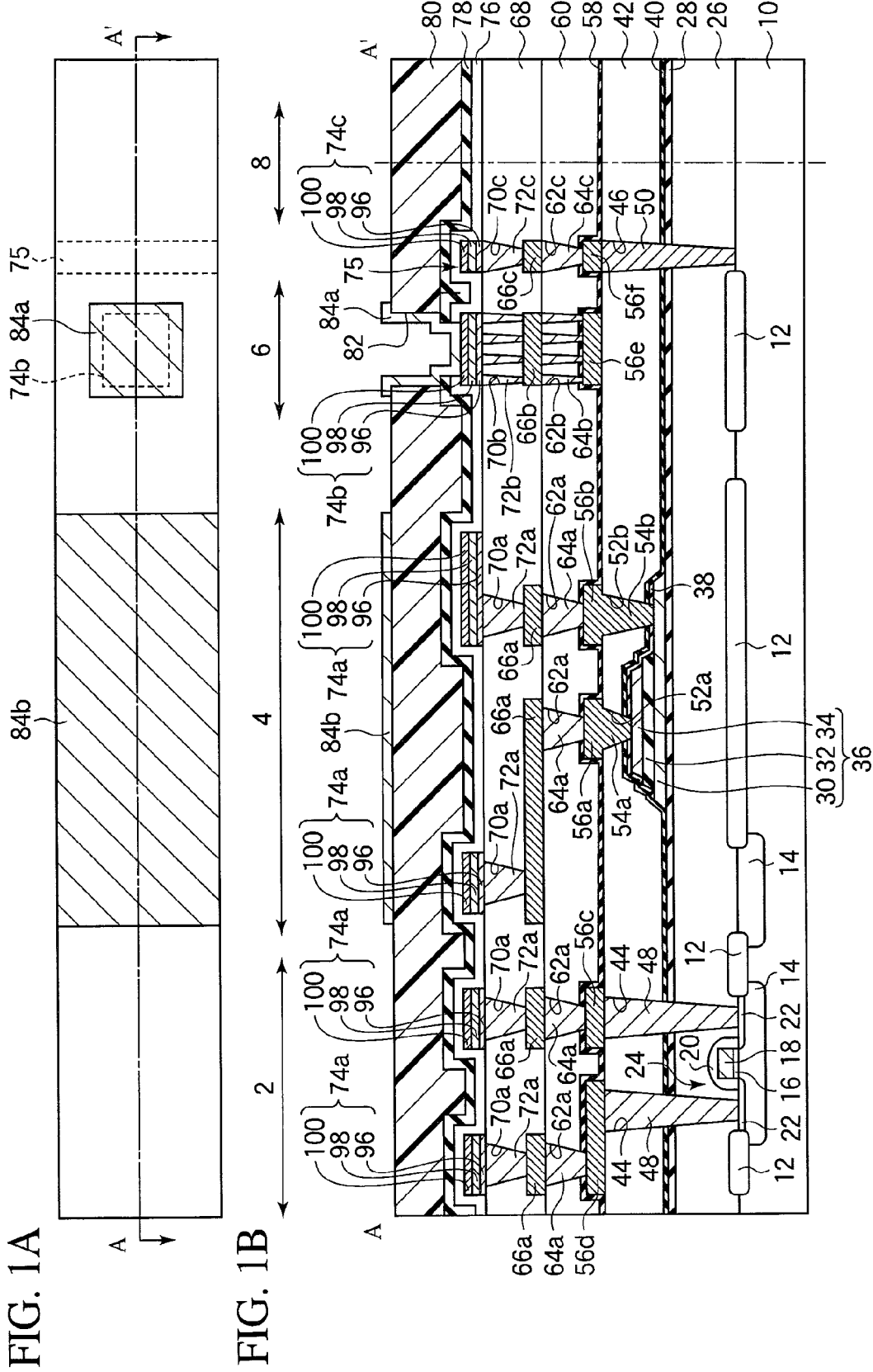

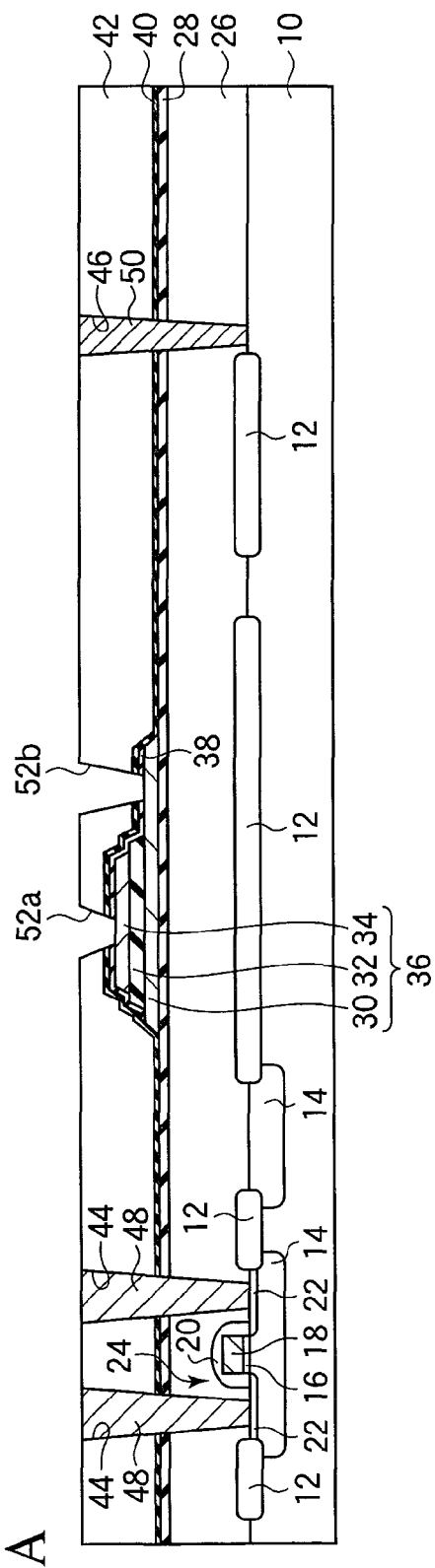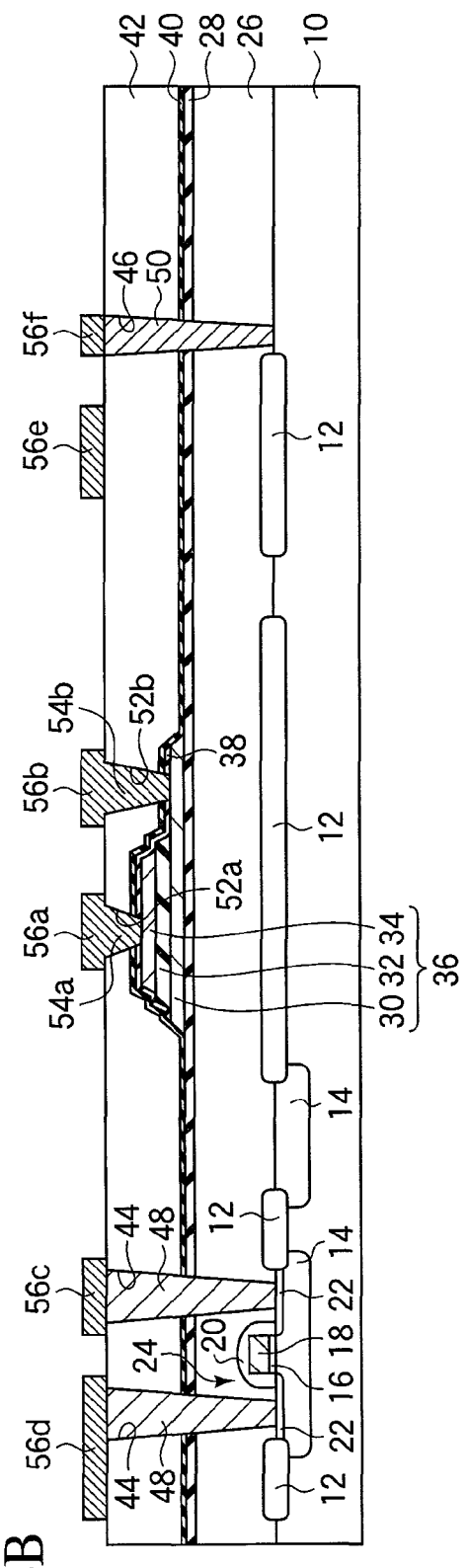

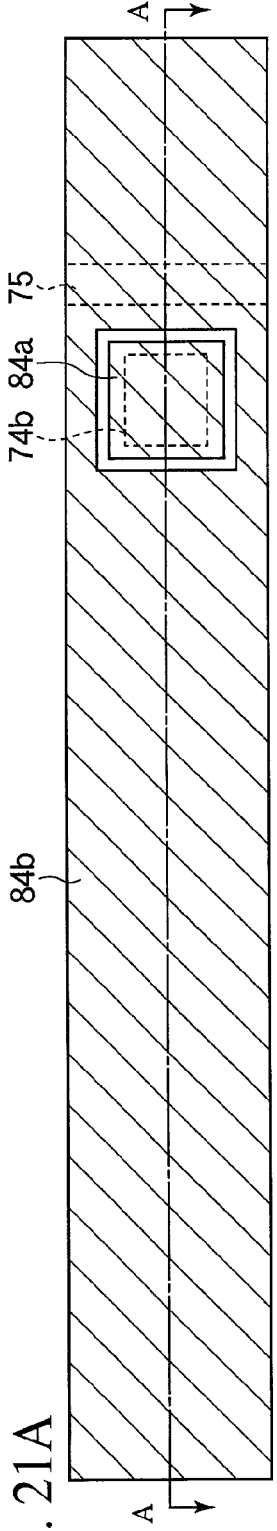
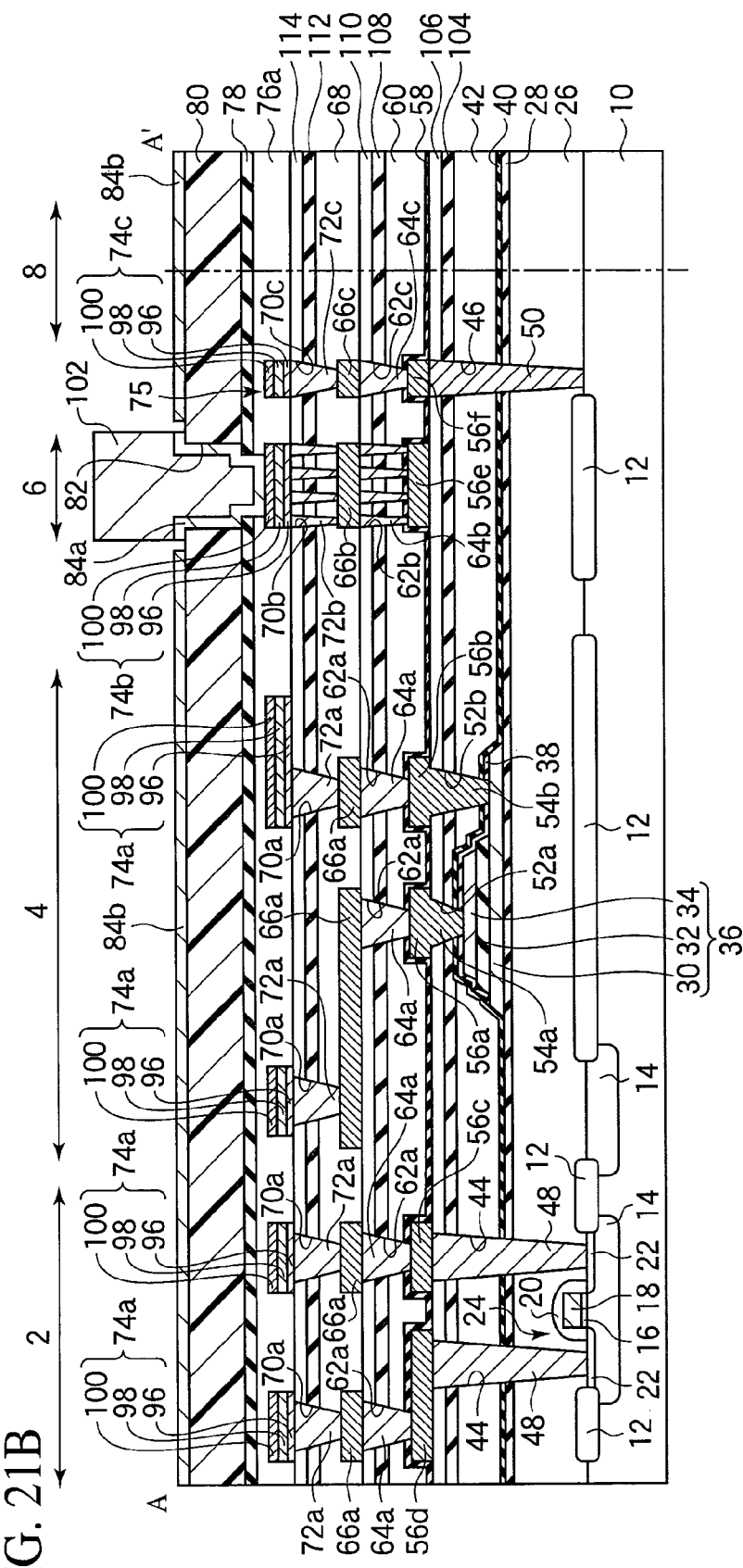
FIG. 21A
FIG. 21B

SEMICONDUCTOR DEVICE AND METHOD FOR MANUFACTURING THE SAME

CROSS REFERENCE TO RELATED APPLICATIONS

This application is a Continuation of International Application No. PCT/JP2005/021810, with an international filing date of Nov. 28, 2005, which designating the United States of America, the entire contents of which are incorporated herein by reference.

TECHNICAL FIELD

The embodiments discussed herein are directed to a semiconductor device and a method for manufacturing the semiconductor device, which may be a semiconductor device including a capacitor using a ferroelectric substance or a high dielectric substance as the dielectric film, and a method for manufacturing the semiconductor device.

BACKGROUND ART

Recently, semiconductor devices including capacitors using ferroelectric substances and high dielectric substances as the dielectric film are proposed. As a semiconductor device using a ferroelectric substance as the dielectric film of the capacitor, the FeRAM (Ferroelectric Random Access Memory) is noted. Such FeRAM is a nonvolatile memory characterized by high operation speed, low electric power consumption, good write/read durability, etc. and is promised to be further developed.

However, when a ferroelectric substance or a high dielectric substance is used as the ferromagnetic film, often hydrogen and water arrive at the dielectric film in steps after the dielectric film has been formed. When hydrogen and water arrives at the dielectric film of the capacitor, the metal oxide forming the dielectric film is reduced by the hydrogen, and the capacitor has the electric characteristic deteriorated.

As techniques for preventing the deterioration of the dielectric film by hydrogen and water, the technique of forming aluminum oxide film, covering the capacitor, and the technique of forming aluminum oxide film on the inter-layer insulation film formed on the capacitor are proposed. Aluminum oxide film has the function of preventing the diffusion of hydrogen and water. Accordingly, the proposed techniques can prevent the arrival of hydrogen and water at the dielectric film, and the deterioration of the dielectric film due to hydrogen and water can be prevented.

Following references disclose the background art.
[Patent Reference 1]
Specification of Japanese Patent Application Unexamined Publication No. Hei 11-233542
[Patent Reference 2]
Specification of Japanese Patent Application Unexamined Publication No. 2004-509479

However, in the proposed semiconductor devices, as the materials of the electrode pads, Al (aluminum), Al—Cu (aluminum-copper) alloys, etc. are used, and when testes, etc are made by touching probes to the electrode pads, often the electrodes pads are broken or deformed. In such cases, often cracks are made in even in the inter-layer insulation film present below the electrode pads. In this case, hydrogen and water intrude from the electrode pads into the inside of the semiconductor devices, and to the dielectric film of the capacitors. When the hydrogen and water arrive at the dielectric film of the capacitors, the metal oxide used as the dielectric film is reduced by hydrogen, and the electric characteristics of the capacitors are deteriorated.

SUMMARY

It is an aspect of the embodiment discussed herein to provide a semiconductor device comprising: a capacitor formed over a semiconductor substrate and including a lower electrode, a dielectric film formed over the lower electrode and an upper electrode formed over the dielectric film; an insulation film formed over the semiconductor substrate and the capacitor; and an electrode pad formed over the insulation film and including an alloy film of aluminum and magnesium.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 1A and 1B are a plan view and a sectional view of the semiconductor device according to a first embodiment.

FIGS. 4A and 4B are sectional views of the semiconductor device according to the first embodiment in the steps of the method for manufacturing the semiconductor device, which illustrate the method (Part 3).

FIGS. 21A and 21B are a plan view and a sectional view of the semiconductor device according to an eleventh embodiment.

DETAILED DESCRIPTION OF THE PREFERRED EMBODIMENTS

A First Embodiment

Figure 2A:
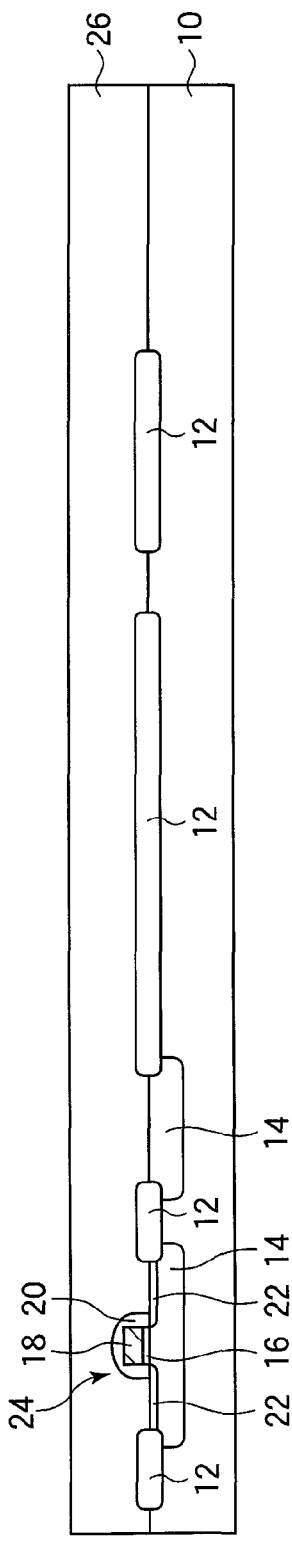
FIGS. 2A and 2B are sectional views of the semiconductor device according to the first embodiment in the steps of the method for manufacturing the semiconductor device, which illustrate the method (Part 1).

The semiconductor device according to a first embodiment and the method for manufacturing the semiconductor device will be explained with reference to FIGS. 1A to 7.

(The Semiconductor Device)

First, the semiconductor device according to the present embodiment will be explained with reference to FIGS. 1A and 1B. FIGS. 1A and 1B are a plan view and a sectional view of the semiconductor device according to the present embodiment. FIG. 1B is the sectional view along the line A-A' in FIG. 1A. In FIGS. 1A and 1B, a logic part (a peripheral circuit region) 2 is illustrated on the left side of the drawing, an FeRAM cell part (a memory cell region) 4 is illustrated on the right side of the logic part 2, an electrode pad part 6 is illustrated on the right side of the FeRAM cell part 4, and a scribe region 8 is illustrated on the right side of the electrode pad part 6. The two-dot chain line in FIGS. 1A and 1B indicates a cut part for cutting the semiconductor wafer 10 in the scribe region 8.

As illustrated in FIGS. 1A and 1B, on the semiconductor substrate 10 of, e.g., silicon, device isolation regions 12 for defining device regions are formed. In the semiconductor substrate 10 with the device isolation regions 12 formed on, wells 14 are formed.

On the semiconductor substrate 10 with the wells 14 formed in, gate electrodes (gate interconnections) 18 of, e.g., polysilicon are formed with a gate insulation film 16 of, e.g., a 6-7 nm-thickness silicon oxide film formed therebetween. The gate length is set at, e.g., 0.36 µm. On the gate electrodes 18, a silicon oxide film is formed. On the side wall of the gate electrodes 18, a sidewall insulation film 20 of silicon oxide film is formed.

On both sides of each gate electrode 18 with the sidewall insulation film 20 formed on, a source/drain diffused layer 22 is formed. Thus, transistors each including the gate electrode 18 and the source/drain diffused layer 22 are formed.

The transistors 24 are formed on the semiconductor substrate 10 in the FeRAM region 4 but are not illustrated in FIGS. 1A and 1B. The transistors 24 formed on the semiconductor substrate 10 in the FeRAM region 4 are each connected to, e.g., the lower electrode 30 or the upper electrode 34 of a capacitor 36.

On the silicon substrate 10 with the transistors 24 formed on, an inter-layer insulation film 26 of a silicon nitride oxide film (not illustrated) and a silicon oxide film (not illustrated) and a silicon oxide film not illustrate) is formed. The surface of the inter-layer insulation film 26 is planarized.

On the inter-layer insulation film 26, an insulating barrier film 28 for preventing the diffusion of hydrogen and water is formed. As a material of the insulating barrier film 28, aluminum oxide (alumina $Al_2O_3$), for example, is used. The film thickness of the insulating barrier film 28 is, e.g., about 20 nm.

The insulating barrier film 28 is formed on the inter-layer insulation film 26 for the following reason. That is, when hydrogen and water arrives at the dielectric film 32 of the capacitors 36 which will be described later, the metal oxide forming the dielectric film 32 is reduced by the hydrogen, and the electric characteristics of the dielectric film 32 are deteriorated. The insulating barrier film 28 is formed on the inter-layer insulation film 26, whereby the arrival of hydrogen and water at the dielectric film 32 from the inter-layer insulation film 26 may be prevented, whereby the deterioration of the electric characteristics of the capacitors 36 may be prevented.

On the insulating barrier film 28, the lower electrodes 30 of the capacitors 36 are formed. The lower electrodes 30 are formed of, e.g., a 155 nm-thickness Pt film.

On the lower electrodes 30, the dielectric film 32 of the capacitors 36 is formed. The dielectric film 32 is formed of, e.g., a 150-200 nm-thickness ferroelectric film. As such ferroelectric film, $PbZr_{1-x}Ti_xO_3$ film (PZT film), for example, is used.

On the dielectric film 32, the upper electrodes 34 of the capacitors 36 are formed. The upper electrodes 34 are formed of, e.g., the layer film of a 50 nm-thickness $IrO_2$ film (not illustrated) and another 200 nm-thickness $IrO_2$ film (not illustrated) sequentially laid.

Thus, the capacitors 36 each including the lower electrode 30 and the dielectric film 32 and the lower electrode 34 are constituted.

On the dielectric film 32 and the upper electrodes 34, an insulating barrier film 38 is formed, covering the dielectric film 32, and the upper surfaces and the side surfaces of the upper electrodes 34. As such insulating barrier film 38, an about 50 nm-thickness aluminum oxide film ($Al_2O_3$), for example, is formed. The insulating barrier film 38 is for preventing the diffusion of hydrogen and water. When hydrogen and water arrive at the dielectric film 32 of the capacitors 36, as described above, the metal oxide forming the dielectric film 32 is reduced by the hydrogen, and the electric characteristics of the capacitors 36 are deteriorated. The insulating barrier film 38 is formed, covering the upper surfaces and the side surfaces of the dielectric film 32 and the upper electrodes 34, whereby the arrival of the hydrogen and water at the dielectric film 32 is prevented, which makes it possible to prevent the deterioration of the electric characteristics of the capacitors 36.

On the capacitors with the insulating barrier film 38 formed on the upper surfaces, another insulating barrier film 40 is formed, covering the insulating barrier film 38 and the capacitors 36. As such insulating barrier film 40, an about 20 nm-thickness aluminum oxide film, for example, is used. The insulating barrier film 40 is for preventing the diffusion of hydrogen and water, as is the insulation barrier film 38 described above.

On the insulating barrier film 40, an inter-layer insulation film 42 of silicon oxide film is formed. The inter-layer insulation film 42 has the surface planarized.

In the inter-layer insulation film 42, the insulating barrier film 40, the insulating barrier film 28 and the inter-layer insulation film 26, contact holes 44 are formed down to the source/drain diffused layer 22.

In the inter-layer insulation film 42, the insulating barrier film 40, the insulating barrier film 28 and the inter-layer insulation film 26, an opening 46 for a metal layer to be buried in is formed. The metal layer 50 forms a part of a seal ring (moisture-resistant ring) 75. The seal ring 75 is for blocking the intrusion of water, etc. from the outside after the semiconductor substrate 10 has been cut in the scribe region 8. The opening 46 is formed generally in a frame inside the scribe region 8.

In the contact holes 44 and the opening 46, a 20 nm-thickness Ti film (not illustrated), for example, is formed. In the contact holes 44 and the opening 46 with the Ti film formed in, a 50 nm-thickness TiN film (not illustrated), for example, is formed. The Ti film and the TiN film form a barrier metal film (not illustrated).

In the contact holes 44 with the barrier metal film formed in, conductor plugs 48 of tungsten are buried. In the opening 46 with the barrier metal film formed in, a metal layer 50 of tungsten is buried.

In the inter-layer insulation film 42 and the insulating barrier films 38, 40, contact holes 52a are formed down to the upper electrodes 34. In the inter-layer insulation film 42 and the insulating barrier films 38, 40, contact holes 52b are formed down to the lower electrodes 30.

In the contact holes 52a and on the inter-layer insulation film 42, conductor plugs 54a and interconnections (the first metal interconnection layer) 56a are formed integral with each other. In the contact holes 52b and on the inter-layer insulation film 42, conductor plugs 54b and interconnections (the first metal interconnection layer) 56b are formed integral with each other. On the inter-layer insulation film 42, a plurality of interconnections (the first metal interconnection layer) 58c-56e are formed. The interconnections 56c, 56d are connected to, e.g., the conductor plugs 48. On the metal layer 50, a metal layer 56f of one and the same film as the interconnections 56a-56e is formed. The metal layer 56f formed a part of the seal ring 75. The interconnections 56a-56f and the conductor plugs 54a, 54b are formed of, e.g., the layer film of a 150 nm-thickness TiN film, a 550 nm-thickness Al—Cu alloy film, a 5 nm-thickness Ti film and a 150 nm-thickness TiN film sequentially laid.

On the inter-layer insulation film 42 with the interconnections 56a-56f on and the conductor plugs 54a, 54b, etc. formed in, an insulating barrier film 58 is formed, covering the interconnections 56a-56f. The insulating barrier film 58 is for preventing the diffusion of hydrogen and water, as is the above-described insulating barrier films 38, 40. As the insulating barrier film 58, a 20 nm-thickness aluminum oxide film, for example, is used.

On the insulating barrier film 58, an inter-layer insulation film 60 of, e.g., silicon oxide film is formed.

In the inter-layer insulation film 60 and the insulating barrier film 58, contact holes 62a are formed respectively down to the interconnections 56a-56d. In the inter-layer insulation film 60 and the insulating barrier film 58, contact holes 62b are formed down to the interconnections 56e. In the inter-layer insulation film 60 and the insulating barrier film 58, an opening 62c is formed down to the metal layer 56f.

In the contact holes 62a, 62b, and in the opening 62c, a 50 nm-thickness TiN film (not illustrated), for example, is formed.

In the contact holes 62a, 62b with the TiN film formed in, conductor plugs 64a, 64b of tungsten are buried. In the opening 62c with the TiN film formed in, a metal layer 64c of tungsten is buried. The metal layer 64c forms a part of the seal ring 75.

On the inter-layer insulation film 60 with the conductor plugs 64a, 64b and the metal layer 64c buried in, interconnections (the second metal interconnection layer) 66a are formed.

On the inter-layer insulation film 60, electrodes 66b of one and the same conduction film as the interconnections 66a are formed. The electrodes 66b are formed in the same plane shape as electrode pads 74b which will be described alter.

On the metal layer 64c, a metal layer 66c of one and the same conduction film as the interconnections 66a and the electrodes 66b is formed. The metal layer 66c forms a part of the seal ring 75.

The interconnections 66a, the electrodes 66b and the metal layer 66c are formed of, e.g., the layer film of a 550 nm-thickness Al—Cu alloy film, a 5 nm-thickness Ti film and a 150 nm-thickness TiN film sequentially laid.

On the inter-layer insulation film 60 with the interconnections 66a, the electrodes 66b and the metal layer 66c formed on, an inter-layer insulation film 68 of, e.g., silicon oxide film is formed. The inter-layer insulation film 68 has the surface planarized.

In the inter-layer insulation film 68, contact holes 70a are formed down to the interconnections 66a. In the inter-layer insulation film 68, contact holes 70b are formed down to the electrodes 66b. In the inter-layer insulation film 68, an opening 70c is formed down to the metal layer 66c. The metal layer 70c forms a part of the seal ring 75.

In the contact holes 70a, 70b and the opening 70c, a barrier metal film of, e.g., a 50 nm-thickness TiN film is formed.

In the contact holes 70a, 70b with the barrier metal film formed in, conductor plugs 72a, 72b of tungsten are buried. In the opening 70c with the barrier metal film formed in, a metal layer 72c of tungsten is formed.

On the inter-layer insulation film 68 with the conductor plugs 72a, 72b and the metal layer 72c buried in, interconnections (the third metal interconnection layer) 74a and electrodes pad 74b are formed. On the metal layer 72c, a metal layer 74c of one and the same conduction film as the interconnections 74a and the electrode pads 74b is formed. The metal layer 74c forms a part of the seal ring 75.

The interconnections 74a, the electrode pads 74b and the metal layer 74c are formed of a TiN film 96, an Al—Cu alloy film 98 formed on the TiN film 96 and a magnesium alloy film 100 formed on the Al—Cu alloy film 98. The TiN film 96 functions as the barrier film which prevents the tungsten used as the material of the conduction plugs 72a, 72b and the metal layer 72c from being diffused into the Al—Cu alloy film 98. The film thickness of the TiN film 96 is, e.g., about 50 nm. The film thickness of the Al—Cu alloy film 98 is, e.g., about 250 nm. The film thickness of the magnesium alloy film 100 is, e.g., about 300 nm.

As the magnesium alloy film 100, magnesium alloy film suitably containing magnesium is used. In other words, as the magnesium alloy film 100, an alloy film of aluminum and magnesium is used. The alloy film of aluminum and magnesium may further contains other elements.

The magnesium alloy film 100 has very high mechanical strength in comparison with Al film, Al—Cu alloy film, etc. The use of the magnesium alloy film 100 as the material of the electrode pads 74b prevents the electrode pads 74b from cracking or generally deformed when a probe 116 is contacted to the electrode 74b with some force in tests, etc. Furthermore, magnesium alloy film 100 has the property of suitably denting when a force is applied to from the outside.

In tests, etc., when a probe 116 is applied to the magnesium alloy film 100 with some force, the part of the magnesium alloy film 100 the probe 116 has been applied to somewhat dents. The part of the magnesium alloy film 100 suitably dents, whereby the impact is absorbed in the electrode pads 74b, whereby the application of strong impact to the inter-layer insulation film 68, etc. below the electrode pads 74b may be prevented. Thus, according to the present embodiment, the inter-layer insulation film 68, etc. below the electrode pads 74b may be prevented from cracking. Thus, according to the present embodiment, hydrogen and water may be prohibited from arriving at the dielectric film 32 of the capacitors 36 via the electrode pads 74b, the inter-layer insulation film 68, etc. and prevent the reduction of the ferroelectric substance forming the dielectric film 32 by the hydrogen. As described above, according to the present embodiment, the dielectric film 32 of the capacitors 36 may be surely prevented from being deteriorated by hydrogen and water, and the semiconductor device may have good electric characteristics and include the capacitors 36 of a long longevity.

As the magnesium alloy film 100, AZ31 alloy, for example, may be used. AZ31 alloy is a magnesium alloy having an aluminum (Al) composition of about 3 weight %, a zinc (Zn) composition of about 1 weight % and a Mg composition substantially of the rest weight %. As such AZ31 alloy, AZ31B (trade name), AZ31M (trade name) by Osaka Fuji Corporation, or others, for example, may be used. AZ31B (trade name) is a magnesium alloy having an Al composition of 2.5-3.5 weight %, a Zn composition of 0.6-1.4 weight %, a manganese (Mn) composition of 0.20-1.0 weight %, an iron (Fe) composition of 0.005 weight % or below, a silicon (Si) composition of 0.10 weight % or below, a copper (Cu) composition of 0.005 weight % or below, a nickel (Ni) composition of 0.005 weight % or below, a calcium (Ca) composition of 0.04 weight % or below and a magnesium (Mg) composition substantially of the rest weight %. AZ31M (trade name) is a magnesium alloy having an Al composition of 2.5-3.5 weight %, a Zn composition of 0.7-1.2 weight %, an Mn composition of 0.004 weight % or below, an Fe composition of 0.007 weight % or below, an Si composition of 0.02 weight % or below, a Cu composition of 0.002 weight % or below, an Ni composition of 0.005 weight % or below, a Ca composition of 0.025-0.06 weight % and an Mg composition substantially of the rest weight %.

The magnesium alloy film 100 is not essentially AZ31 alloy.

For example, as the magnesium alloy film 100, AZ61 alloy may be used. AZ61 alloy is a magnesium alloy having an Al composition (content ratio) of about 6 weight %, a Zn composition of about 1 weight % and a Mg composition substantially of the rest weight %. As such AZ61 alloy, AZ61 (trade name) by Osaka Fuji Kogyo Corporation, or others, for example, can be used. AZ61 (trade name) is a magnesium alloy having an Al composition of 5.5-7.2 weight %, a Zn composition of 0.5-1.5 weight %, an Mn composition of 0.15-0.40 weight %, a Fe composition of below 0.01 weight % or below, an Si composition of 0.10 weight % or below, a Cu composition of 0.10 weight % or below, an Ni composition of 0.005 weight % or below and an Mg composition substantially of the rest weight %.

As the magnesium alloy film 100, AZ91 ally or others may be used. AZ91 alloy is a magnesium ally having an Al composition (content ratio) of about 9 weight %, a Zn composition of about 1 weight % and an Mg composition substantially of the rest weight %. As such AZ91 alloy, AZ91D (trade name) by Osaka Fuji Kogyo Corporation, or others, for example, can be used. AZ91D (trade name) is a magnesium alloy having an Al composition of 8.3-9.7 weight %, a Zn composition of 0.35-1.0 weight %, an Mn composition of 0.15 weight % or below, an Fe composition of 0.005 weight % or below, and an Si composition of 0.10 weight % or below, a Cu composition of 0.03 weight % or below, and Ni composition of 0.002 weight % or below and an Mg composition substantially of the rest weight %.

The magnesium alloy film 100 is not essentially the magnesium alloys described above. Other various magnesium alloys can be suitably used as the material of the magnesium alloy film 100.

As the material of the magnesium alloy film 100, the magnesium alloy having an Al content ratio (composition) of 1-20 weight % is preferable, and the magnesium alloy having an Al content ratio (composition) of 2-10 weight % is more preferable.

The Al content ratio of magnesium alloy film 100 is 1-20 weight %, more preferably 2-10 weight % for the following reason.

That is, the conductivity of magnesium is $22.6 \times 10^6/m\Omega$, and the conductivity of aluminum is $37.7 \times 10^6/m\Omega$. The conductivity of magnesium is considerably lower in comparison with that of aluminum. Accordingly, as the composition of the aluminum of the magnesium alloy film 100 is lower, the magnesium alloy film 100 has the conductivity lowered, and as the composition of the aluminum of the magnesium alloy film 100 is increased, the magnesium alloy film 100 has the conductivity increased. When the composition of the aluminum of the magnesium alloy film 100 is too low, the conductivity is too low, and there is a risk that electro-migration might take place. Mere magnesium, which is not alloyed, is an easily oxidizable substance. Accordingly, when the Al composition of the magnesium alloy film 100 is too low, the magnesium alloy film 100 is easily oxidized, and there is a risk that a required conductivity could not be obtained. On the other hand, when the aluminum composition of the magnesium alloy film 100 is too high, i.e., when the magnesium composition of the magnesium alloy film 100 is too high, the magnesium alloy film 100 may not have very high mechanical strength. For such reason, the magnesium alloy film 100 is formed of the magnesium alloy preferably having an aluminum content ratio (composition) of 1-20 weight %, more preferably, an aluminum content ratio (composition) of 2-10 weight %.

The seal ring 75 is formed of the metal layer 50, the metal layer 56f, the metal layer 64c, the metal layer 66c, the metal layer 72c and the metal layer 74c. As described above, the seal ring 75 is for blocking the intrusion of water, etc. from the outside after the semiconductor wafer 10 has been cut in the scribe region 8.

On the inter-layer insulation film 68 with the interconnections 74a, the electrode pads 74b and the metal layer 74c formed on, a protection film 76 of, e.g., a 100 nm-thickness silicon oxide film is formed.

On the protection film 76, a protection film 78 of, e.g., a 350 nm-thickness silicon nitride film is formed. The silicon nitride film 78 is for blocking the water, etc. discharged from a protection film 80 which will be described later.

On the protection film 78, the protection film 80 of, e.g., polyimide is formed.

In the protection film 80, the protection film 78 and the protection film 76, openings 82 are formed down to the electrode pads 74b.

In the openings 82, a conducting barrier film 84a is formed, e.g., of a 100-200 nm-thickness Ti film and a Pd film of 250 nm-thickness or above sequentially laid. The film thickness of the Ti film here is, e.g., 150 nm. The conducting barrier film 84a is formed larger than the electrode pads 74b. That is, the plane shape of the conducting barrier film 84a is larger than the plane shape of the electrode pads 74b, and the outer periphery of the conducting barrier film 84a is larger than that of the electrode pads 74b.

Above the region where the capacitors 36 are formed, i.e., above the FeRAM cell region, a conducting barrier film 84b is formed solid.

The Pd film forming the conducting barrier films 84a, 84b has the property of absorbing hydrogen. Accordingly, the conducting barrier films 84a, 84b have the function of preventing the diffusion of hydrogen and water. In the present embodiment, because of the conducting barrier film 84a formed on the electrode pads 74b, the intrusion of hydrogen and water from the electrode pad part 6 into the interior of the semiconductor device may be more surely prevented. Because of the conducting barrier film 84a formed larger than the electrode pads 74b, the intrusion of hydrogen and water from the electrode pad part 6 into the interior of the semiconductor device may be more surely prevented. Because of the conducting barrier film 84b formed above the region where the capacitors 36 are formed, which is the FeRAM region 4, the arrival of hydrogen and water at the capacitors 36 may be more surely prevented.

Thus, the semiconductor device according to the present embodiment is constituted.

The semiconductor device according to the present embodiment is characterized mainly in that the electrode pads 74a have the magnesium alloy film 100.

As described above, in the case that as the material of the electrode pads, mere Al, the Al—Cu alloy or others are used, when tests, etc. are made on the semiconductor device by contacting a probe to the electrode pads, often the electrode pads are broken or deformed. In such case, often the inter-layer insulation film below the electrode pads is also cracked. In such case, hydrogen and water intrude from the electrode pad part into the interior of the semiconductor device and often arrive at the dielectric film of the capacitors. Then, the ferroelectric substance used as the dielectric film is reduced by the hydrogen, and electric characteristics of the capacitors are deteriorated.

In contrast to this, in the present embodiment, as the material of the electrode pads 74b, magnesium alloy film is used. As described above, the magnesium alloy is a material whose mechanical strength is very high in comparison with Al, the Al—Cu alloy, etc. Accordingly, the use of the magnesium alloy as the material of the electrode pads 74b is used, whereby even when a probe 116 is contacted to the electrode pads 74b with considerably large forces in tests, etc., the electrode pads 74b are neither cracked nor generally deformed. Furthermore, as described above, the magnesium alloy has the property of suitably denting when a force is applied from the outside. Accordingly, when the probe 116 is contacted to the electrode pads 74b with a considerably large force in tests, etc., the parts of the electrode pads 74b, to which the probe 116 has been contacted a little dent. The electrode pads 74b partially dent and absorb the impact, whereby the application of strong impacts to the inter-layer insulation film 58, etc. below the electrode pads 74b may be prevented. Thus, according to the present embodiment, the inter-layer insulation film 68, etc. below the electrode pads 84b may be prevented from cracking. Thus, according to the present embodiment, the arrival of hydrogen and water at the dielectric film 32 of the capacitors 36 via the electrode pads 74b, the inter-layer insulation film 68, etc. may be prevented, and the metal oxide forming the dielectric film 32 may be prevented from being reduced by the hydrogen. Thus, according to the present embodiment, the semiconductor device including the capacitors 36 having good electric characteristics and long longevity may be provided.

(The Method for Manufacturing the Semiconductor Device)

Next, the method for manufacturing the semiconductor device according to the present embodiment will be explained with reference to FIGS. 2A to 7. FIGS. 2A to 7 are sectional views of the semiconductor device according to the present embodiment in the steps of the method for manufacturing the semiconductor device, which explained the method.

First, as illustrated in FIG. 2A, the device isolation regions 12 for defining the device regions are formed on the semiconductor substrate 10, of e.g., silicon by LOCOS (LOCal Oxidation of Silicon).

Next, a dopant impurity is implanted by ion implantation to form the well 14.

Next, the gate insulation film 16 of a 6-7 nm-thickness silicon oxide film is formed on the device regions by, e.g., thermal oxidation.

Next, a 120 nm-thickness polysilicon film 18 is formed by, e.g., CVD. The polysilicon film 18 is to be the gate electrodes, etc.

Next, Then, the polysilicon film 18 is patterned by photo-lithography. Thus, the gate electrodes 18 of the polysilicon film are formed. The gate length is, e.g., 0.36 µm.

Then, with the gate electrodes 18 as the mask, a dopant impurity is implanted into the semiconductor substrate 10 on both sides of the gate electrodes 18 by ion implantation. Thus, the extension regions (not illustrated) forming the shallow regions of the extension source/drains are formed.

Then, a 150 nm-thickness silicon oxide film 20 is formed on the entire surface by, e.g., CVD.

Next, the silicon oxide film 20 anisotropically etched. Thus, the sidewall insulation film 20 of the silicon oxide film is formed on the side walls of the gate electrodes 18.

Next, by using as the mask the gate electrode 18 having the sidewall insulation film 20 formed on, a dopant impurity is implanted into the semiconductor substrate 10 on both sides of the gate electrodes 18 by ion implantation. Thus, the impurity diffused layer (not illustrated) forming the deep regions of the extension source/drains are formed. The extension regions and the deep impurity diffused layer form the source/drain diffused layer 22.

Thus, transistors 24 each including the gate electrode 18 and the source/drain diffused layer 22 are formed.

Next, on the entire surface, a 200 nm-thickness silicon nitride oxide film (SiON film) (not illustrated), for example, is formed by, e.g., plasma CVD.

Next, on the entire surface, a 600 nm-thickness silicon oxide film (not illustrated) is formed by, e.g., plasma TEOSCVD.

Then, by, e.g., CMP, the surface of the silicon oxide film is polished by about 200 nm to have the surface planarized.

Next, on the entire surface, a 100 nm-thickness silicon oxide film (not illustrated) is formed by, e.g., plasma TEOSCVD. Thus, the inter-layer insulation film 26 is formed of the silicon nitride oxide film, the silicon oxide film and the silicon oxide film.

Next, by dehydration processing, water is removed from the inter-layer insulation film 26. The conditions for the dehydration process are as exemplified below. The temperature for the dehydration process is, e.g., 650° C. The atmosphere for the dehydration process is a nitrogen atmosphere. The dehydration process period of time is, e.g., 30 minutes.

Figure 2B:
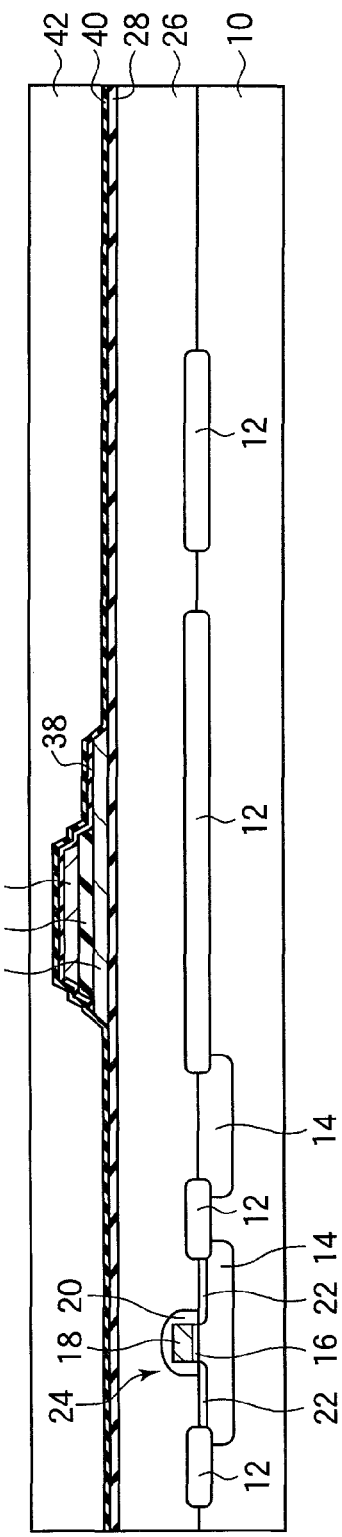

Next, as illustrated in FIG. 2B, the insulating barrier film 28 of, e.g., a 20 nm-thickness aluminum oxide film is formed by, e.g., PVD (Physical Vapor Deposition), more specifically, sputtering. The insulating barrier film 28 is for preventing the arrival of hydrogen and water at the capacitors 36 from the inside of the inter-layer insulation film 26.

Next, thermal processing, of 650° C. and 60 seconds is made in an oxygen atmosphere by, e.g., RTA (Rapid Thermal Annealing). This thermal processing is for improving the film quality of the insulating barrier film 28. This thermal processing makes it possible to form the conduction film 30 of good orientation when the conduction film 30 is formed on the insulating barrier film 28.

Next, on the entire surface, the conduction film 30 of a 155 nm-thickness Pt film is formed by, e.g., PVD. The conduction film 30 is to be the lower electrodes of the capacitors 36.

Then, on the entire surface, the dielectric film 32 is formed by, e.g., PVD. The dielectric film 32 is to be the dielectric film of the capacitors. As the dielectric film 32, a ferroelectric film, for example, is formed. More specifically, as the dielectric film 32, a PZT film of, e.g., a 150-200 nm-thickness is formed.

Next, thermal processing, e.g., of 585° C. and 90 minutes is made in an oxygen atmosphere by, e.g., RTA. In the thermal processing, the flow rate of the oxygen gas to be introduced into the chamber is, e.g., 0.025 liters/minutes. This thermal processing is for improving the film quality of the dielectric film 32.

Then, by, e.g., PVD, a 50 nm-thickness $IrO_2$ film (not illustrated), for example, is formed.

Then, thermal processing, e.g., of 725° C. and 20 seconds is made in an oxygen atmosphere by, e.g., RTA. This thermal processing is for preventing the occurrence of abnormalities in the surface of the upper electrodes 36. The flow rate of the oxygen gas to be introduced into the chamber in the thermal processing is, e.g., 0.025 liters/minutes.

Next, a 200 nm-thickness $IrO_2$ film (not illustrated) is formed by, e.g., PVD. Thus, the layer film 34 is formed of 2 layers of the $IrO_2$ film laid. The layer film 34 is to be the upper electrodes of the capacitors 36.

Next, on the entire surface, a photoresist film (not illustrated) is formed by spin coating.

Next, by photolithography, the photoresist film is patterned into a plane shape of the upper electrodes 34 of the capacitors 36.

Then, with the photoresist film as the mask, the layer film 34 is etched. Thus, the upper electrodes 34 of the layer film are formed. Then, the photoresist film is released.

Next, thermal processing, e.g., of 650° C. and 60 minutes is made in an oxygen atmosphere. This thermal processing is for feeding oxygen to the dielectric film so as to recover the film quality of the dielectric film 32. The flow rate of the oxygen gas to be introduced into the chamber for the thermal processing is, e.g., 20 liters/minute. For the thermal processing, a vertical electric annealer is used.

Then, on the entire surface, a photoresist film is formed by spin coating.

Then, by photolithography, the photoresist film is patterned into the plane shape of the dielectric film 32 of the capacitors.

Next, with the photoresist film as the mask, the dielectric film 32 is etched. Then, the photoresist film is released.

Next, thermal processing, e.g., of 350° C. and 60 minutes is made in an oxygen atmosphere. This thermal processing is for feeding oxygen to the dielectric film 32 so as to recover the film quality of the dielectric film 32. The flow rate of oxygen gas to be fed into the changer for the thermal processing is, e.g., 20 liters/minute. For the thermal processing, a vertical electric annealer, for example, is used.

Then, on the entire surface, an insulating barrier film 38 of a 50 nm-thickness aluminum oxide film is formed. The insulating barrier film 38 is for preventing the diffusion of hydrogen and water.

Next, thermal processing, e.g., 550° C. and 60 minutes is made in an oxygen atmosphere. This thermal processing is for improving the film quality of the insulating barrier film 38 and feeding oxygen to the dielectric film 32 so as to recover the film quality of the dielectric film 32. The flow rate of oxygen gas to be fed into the chamber for the thermal processing is, e.g., 20 liters/minute. For the thermal processing, a vertical electric annealer, for example is used.

Next, on the entire surface, a photoresist film is formed by spin coating.

Then, by photolithography, the photoresist film is patterned into the plane shape of the lower electrodes 30 of the capacitors.

Then, with the photoresist film as the mask, the insulating barrier film 38 and the conduction film 30 are etched. Thus, the lower electrodes 30 are formed of the conduction film. The insulating barrier film 38 remains, covering the upper electrodes 34 and the dielectric film 32. Then, the photoresist film is released.

Next, thermal processing, e.g., of 650° C. and 60 minutes is made in an oxygen atmosphere. This thermal processing is for feeding oxygen to the dielectric film so as to cover the film quality of the dielectric film. The flow rate to be fed into the chamber for the thermal processing is, e.g., 20 liters/minute. For the thermal processing, a vertical electric annealer, for example, is used.

Then, on the entire surface, the insulating barrier film 40 of a 20 nm-thickness aluminum oxide film is formed by, e.g., PVD. The insulating barrier film 40 is for preventing the diffusion of hydrogen and water.

Next, thermal processing, e.g., of 550° C. and 60 minutes is made in an oxygen atmosphere. This thermal processing is for improving the film quality of the insulating barrier film 40 and feeding oxygen to the dielectric film 32 so as to recover the film quality of the dielectric film 32. The flow rate of oxygen gas to be fed into the chamber for the thermal processing is, e.g., 20 liters/minutes. For the thermal processing, a vertical electric annealer, for example, is used.

Next, on the entire surface, the inter-layer insulation film 42 of, e.g., a 1500 nm-thickness silicon oxide film is formed by plasma TEOSCVD.

Then, the surface of the inter-layer insulation film 42 is planarized by, e.g., CMP.

Next, in a plasma atmosphere generated with $N_2O$ gas, thermal processing is made (plasma annealing). The plasma annealing is for removing water present in the inside of the inter-layer insulation film 42 and nitriding the surface of the inter-layer insulation film 42. The plasma annealing may be made with, e.g., a CVD system. The conditions for the plasma annealing is, e.g., 350° C. and 2 minutes.

Next, on the entire surface a photoresist film is formed by spin coating.

Next, by photolithography, openings are formed in the photoresist film. The openings are for forming the contact holes in the inter-layer insulation film.

Figure 3A:
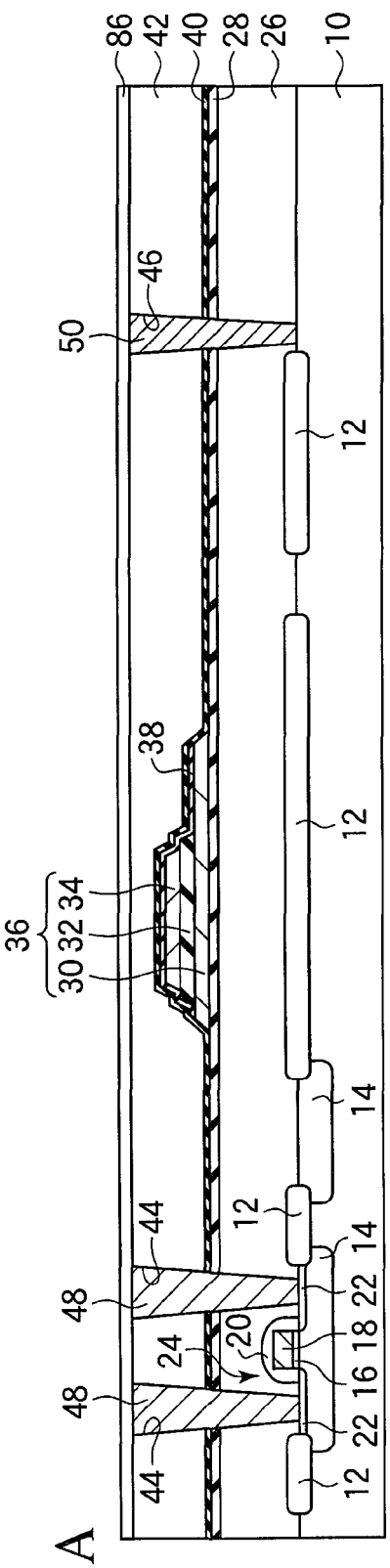
FIGS. 3A and 3B are sectional views of the semiconductor device according to the first embodiment in the steps of the method for manufacturing the semiconductor device, which illustrate the method (Part 2).

Then, with the photoresist film as the mask, the inter-layer insulation film 42, the insulating barrier film 40, the insulating barrier film 28 and the inter-layer insulation film 26 are etched to form the contact holes 44 down to the source/drain diffused layers 22 and the opening 46 down to the semiconductor substrate 10 (see FIG. 3A).

Then, on the entire surface, a 20 nm-thickness Ti film (not illustrated) and a 50 nm-thickness TiN film (not illustrated)

are sequentially formed by, e.g., PVD. Thus, the barrier metal film (not illustrated) of the Ti film and TiN film is formed in the contact holes 44 and the opening 46.

Next, on the entire surface, a 500 nm-thickness tungsten film is formed by, e.g., CVD.

Then, by, e.g., CMP, the tungsten film and the barrier metal film are polished until the surface of the inter-layer insulation film 42 is exposed. Thus, the conductor plugs 48 of tungsten are buried in the contact holes 44. In the opening 46, the metal layer 50 of tungsten is buried. The metal layer 50 is to be a part of the seal ring.

Then, in a plasma atmosphere generated with $N_2O$ gas, thermal processing is made (plasma annealing). The plasma annealing is for removing water present inside the inter-layer insulation film 42 and nitriding the surface of the inter-layer insulation film 42. The plasma annealing may be made with, e.g., a CVD system. The conditions for the plasma annealing are, e.g., 350° C. and 2 minutes.

Next, on the entire surface, by, e.g., plasma CVD, a 100 nm-thickness silicon nitride film 86, for example, is formed. The silicon nitride film 86 is for preventing the occurrence of damages in the surfaces of the conductor plugs 48.

Figure 3B:
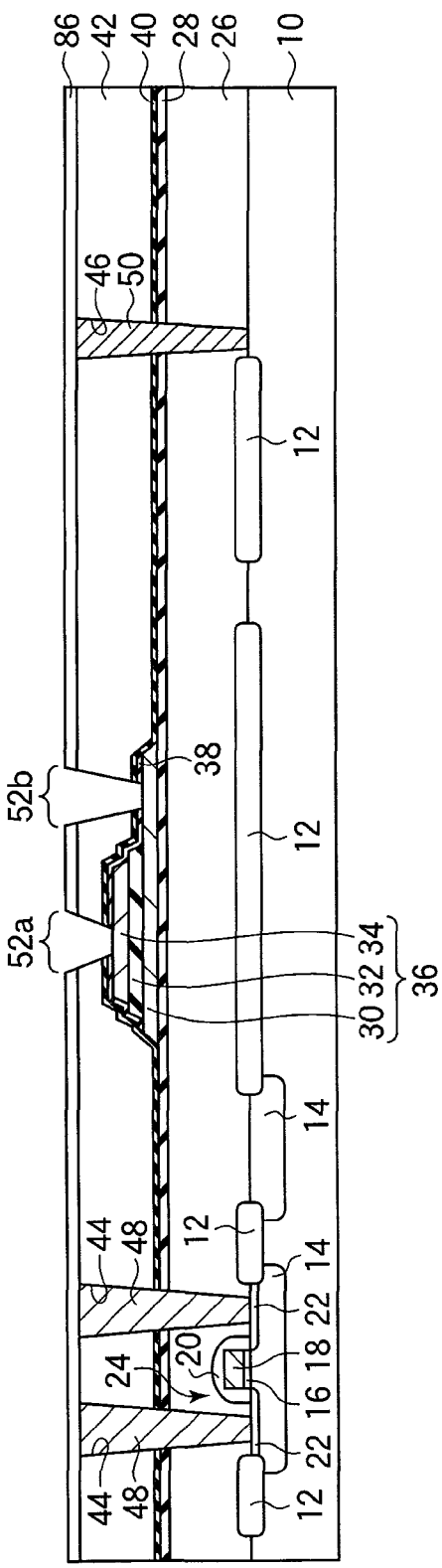

Next, as illustrated in FIG. 3B, in the inter-layer insulation film 42 and the silicon nitride film 86, contact holes 52a and the contact holes 52b are formed by photolithography respectively down to the upper electrodes 34 and down to the lower electrodes 30.

Then, thermal processing, e.g., of 500° C. and 60 minutes is made in an oxygen atmosphere. The thermal processing is for feeding oxygen to the dielectric film 32 of the capacitors 36 and recovering the film quality of the dielectric film 32. The flow rate of the oxygen gas to be fed into the chamber for the thermal processing is, e.g., 20 liters/minutes. For the thermal processing, a vertical electric annealer, for example, is used.

Then, as illustrated in FIG. 4A, by etching back the entire surface, for example, the silicon nitride oxide film 86 present on the inter-layer insulation film 42 is removed.

Then, on the entire surface, a 150 nm-thickness TiN film, a 550 nm-thickness Al—Cu alloy film, a 5 nm-thickness Ti film and a 150 nm-thickness TiN film are sequentially formed by, e.g., PVD. Thus, the layer film of the TiN film, the Al—Cu alloy film, the Ti film and TiN film is formed.

Next, the layer film is patterned by photolithography. Thus, in the contact holes 52a and on the inter-layer insulation film 42, the conductor plugs 54a and the interconnections 56a of the layer film are formed integral with each other. In the contact holes 52b and on the inter-layer insulation film 42, the conductor plugs 54b and the interconnections 56b of the layer film are formed integral with each other. On the inter-layer insulation film 42, the interconnections 56c-56e of the layer film are formed (see FIG. 4B). On the metal layer 50, the metal layer 56f of the layer film is formed. The metal layer 56f is to be a part of the seal ring.

Next, thermal processing, e.g., of 350° C. and 30 minutes is made in a nitrogen atmosphere. The thermal processing makes it possible to improve the adhesion of the insulating barrier film 58 to the base when the insulating barrier film 58 is formed in a later step. The flow rate of nitrogen gas to be introduced into the chamber in the thermal processing is, e.g., 20 liters/minutes. For the thermal processing, a vertical electric annealer, for example, is used.

Figure 5A:
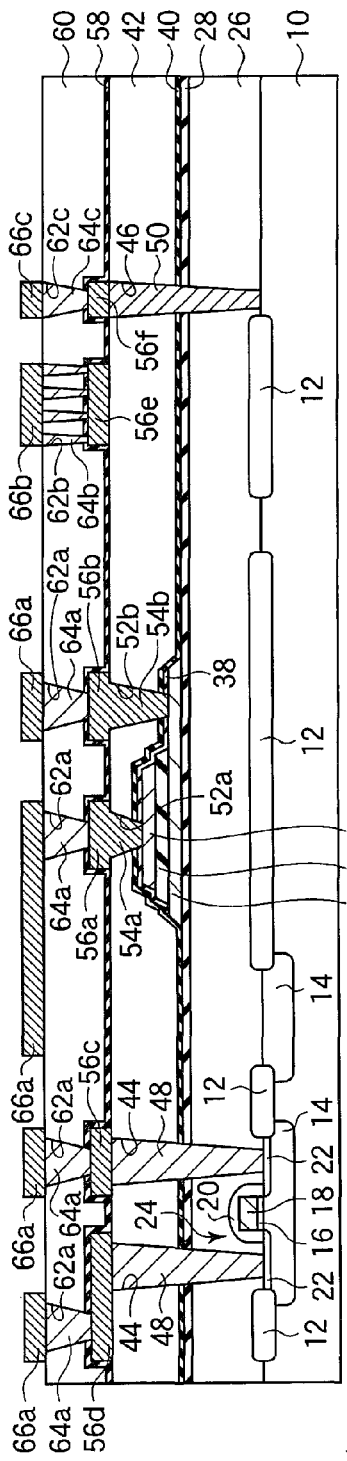
FIGS. 5A and 5B are sectional views of the semiconductor device according to the first embodiment in the steps of the method for manufacturing the semiconductor device, which illustrate the method (Part 4).
Figure 5B:
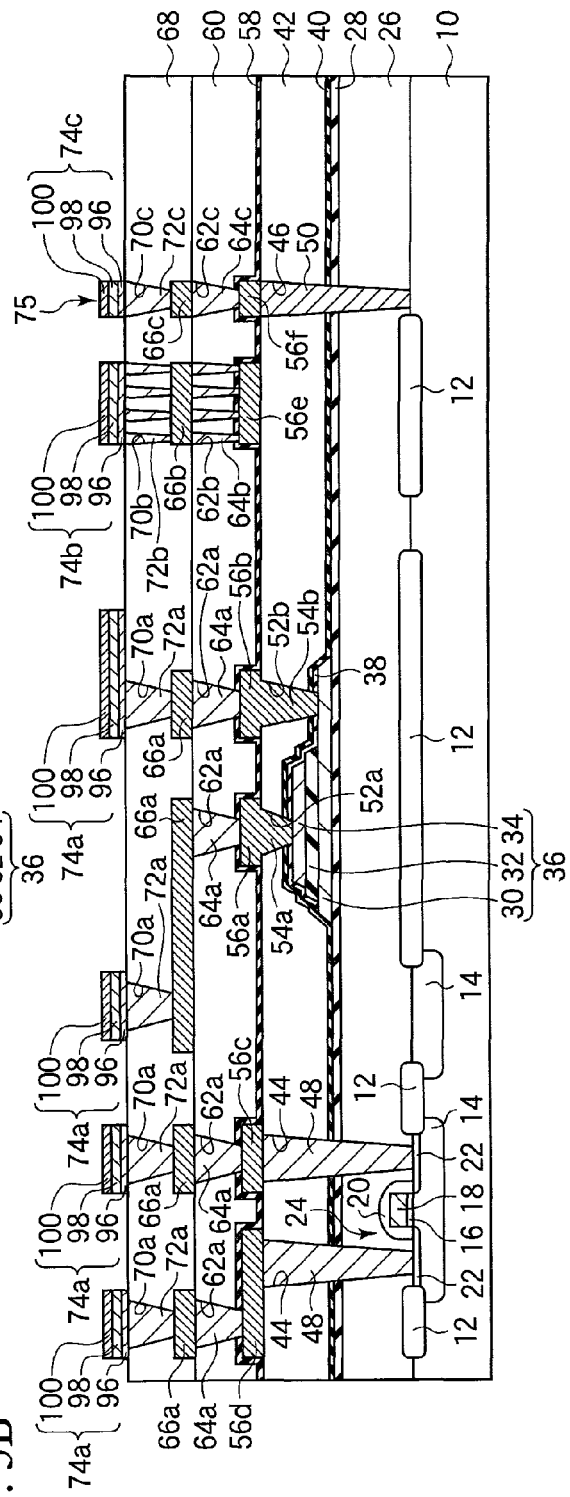

Next, as illustrated in FIG. 5A, on the entire surface, the insulating barrier film 58 of, e.g., a 20 nm-thickness aluminum oxide is formed by, e.g., PVD. The insulating barrier film 58 prevents the arrival of hydrogen and water at the dielectric film 32 of the capacitors 36.

Next, on the entire surface, a 2600 nm-thickness silicon oxide film (not illustrated) is formed by, e.g., plasma TEOSCVD.

Then, the surface of the silicon oxide film is planarized by, e.g., CMP.

Then, thermal processing (plasma annealing) is made in a plasma atmosphere generated with $N_2O$ gas. The plasma annealing is for removing water present inside the silicon oxide film and nitriding the surface of the silicon oxide film. The plasma annealing may be made with, e.g., a CVD system. The conditions for the plasma annealing are, e.g., 350° C. and 4 minutes.

Next, on the entire surface, a 100 nm-thickness silicon oxide film (not illustrated) is formed by, e.g., plasma TEOSCVD.

Then, thermal processing (plasma annealing) is made in a plasma atmosphere generated with $N_2O$ gas. The plasma annealing is for removing water present inside the silicon oxide film and nitriding the surface of the silicon oxide film. The plasma annealing may be made with, e.g., a CVD system. The conditions for the plasma annealing are, e.g., 350° C. and 2 minutes.

Thus, the inter-layer insulation film 60 of the silicon oxide film and the silicon oxide film is formed. The inter-layer insulation film 60 has the surface planarized.

Then, by photolithography, the contact holes 62a, the contact holes 62b and the opening 62c are formed respectively down to the interconnections 56a-56d, down to the electrodes 56e and down to the metal layer 56f.

Next, on the entire surface, the barrier metal film (not illustrated) of a 50 nm-thickness TiN film is formed by, e.g., PVD.

Next, on the entire surface, a 650 nm-thickness tungsten film is formed by, e.g., CVD.

Then, the tungsten film and the barrier metal film are etched back until the surface of the inter-layer insulation film 60 is exposed. Thus, the conductor plugs 64a, 64b of tungsten are buried in the contact holes 62a, 62b. In the opening 62c, the metal layer 64c of tungsten is buried.

The conductor plugs 64a, 64b and the metal layer 64c may be formed by polishing the tungsten film and the barrier metal film by CMP until the surface of the inter-layer insulation film 60 is exposed.

Next, on the entire surface, a 550 nm-thickness Al—Cu alloy film, a 5 nm-thickness Ti film, a 150 nm-thickness TiN film are sequentially formed by, e.g., PVD. Thus, the layer film of the Al—Cu alloy film, the Ti film and the TiN film is formed.

Then, the layer film is patterned by photolithography. Thus, the interconnections 66a, the electrodes 66b and the metal layer 66c of the layer film are formed.

Then, on the entire surface, a 2200 nm-thickness silicon oxide film (not illustrated) is formed by, e.g., plasma TEOSCVD.

Then, the surface of the silicon oxide film is planarized by, e.g., CMP.

Next, thermal processing is made in a plasma atmosphere generated with $N_2O$ gas (plasma annealing). The plasma annealing is for removing water present inside the silicon oxide film and nitriding the surface of the silicon oxide film. The plasma annealing may be made with, e.g., a CVD system. The conditions for the plasma annealing are, e.g., 350° C. and 4 minutes.

Next, on the entire surface, a 100 nm-thickness silicon oxide film (not illustrated) is formed by, e.g., plasma TEOS CVD.

Then, thermal processing is made in a plasma atmosphere generated with $N_2O$ gas (plasma annealing). The plasma annealing is for removing water present inside the silicon oxide film and nitriding the surface of the silicon oxide film. The plasma annealing may be made with, e.g., a CVD system. The conditions for the plasma annealing are, e.g., 350° C. and 2 minutes. Thus, the inter-layer insulation film 68 of the silicon oxide film and the silicon oxide film is formed (see FIG. 5B).

Next, by photolithography, the contact holes 70a, the contact holes 70b and opening 70c are formed in the inter-layer insulation film 68 respectively down to the interconnections 66a, down to the electrodes 66b and down to the metal layer 66c.

Then, on the entire surface, a barrier metal film (not illustrated) of a 50 nm-thickness TiN film is formed by, e.g., PVD.

Next, on the entire surface, a 650 nm-thickness tungsten film is formed by, e.g., CVD.

Next, the tungsten film and the barrier metal film are etched back until the surface of the inter-layer insulating film is exposed. Thus, the conductor plugs 72a, 72b of tungsten are buried in the contact holes 70a, 70b. In the opening 70c, the metal layer 72c of tungsten is buried.

The conductor plugs 72a, 72b and the metal layer 72c may be formed by polishing the tungsten film and the barrier metal film by CMP until the surface of the inter-layer insulation film 86 is exposed.

Next, on the entire surface, a 50 nm-thickness TiN film 96, for example, is formed by, e.g., PVD. The TiN film 96 is for preventing the tungsten of the conductor plugs 72a, 72b and the metal layer 72c from being diffused into the Al—Cu alloy film 98.

Next, on the entire surface, a 250 nm-thickness Al—Cu alloy film 98, for example, is formed by, e.g., PVD.

Then, on the entire surface, a 300 nm-thickness magnesium alloy film 100, for example, is formed. As described above, the content ratio (composition) of Al of the magnesium alloy film 100 is preferably 1-20 weight %, more preferably 2-10 weight %.

Thus, the layer film of the TiN film 96, the Al—Cu alloy film 98 and the magnesium alloy film 100 is formed. This layer film is to be the interconnections 74a, the electrode pads 74b and the metal layer 74c.

Next, on the entire surface, a photoresist film (not illustrated) is formed by spin coating.

Next, by photolithography, the photoresist film is patterned into plane shapes to the interconnections 74a, the electrode pads 74b and the metal layer 74c.

Next, with the photoresist film as the mask, the layer film is etched by sputter etching using, e.g., argon ions. The conditions for the etching the layer film are as exemplified below. The applied high-frequency electric power (source power) is, e.g., 1000-2000 W. The source power here is, e.g., 1400 W. The bias electric power is, e.g., 500-1000 W. The bias electric power here is, e.g., 800 W. The flow rate of Argon (Ar) gas to be fed into the chamber is, e.g., 20-40 sccm. The flow rate of the Ar gas here is 30 sccm. The flow rate of $Cl_2$ gas to be fed into the chamber is, e.g., 10-30 sccm. The flow rate of $Cl_2$ gas here is 20 sccm. In place of $Cl_2$ gas, gas of fluorine compound may be used. The pressure inside the chamber is, e.g., 0.5-1.5 Pa. The pressure inside the chamber here is 0.7 Pa. When the layer film is etched under these conditions, the etching rate of the layer film becomes 200-500 nm/minute.

Thus, the interconnections 74a, the electrode pads 74b and the metal layer 74c are formed. The seal ring 75 is formed of the metal layer 50, the metal layer 56f, the metal layer 64c, the metal layer 66c, the metal layer 72c and the metal layer 74c. Then, the photoresist film is released.

Figure 6:
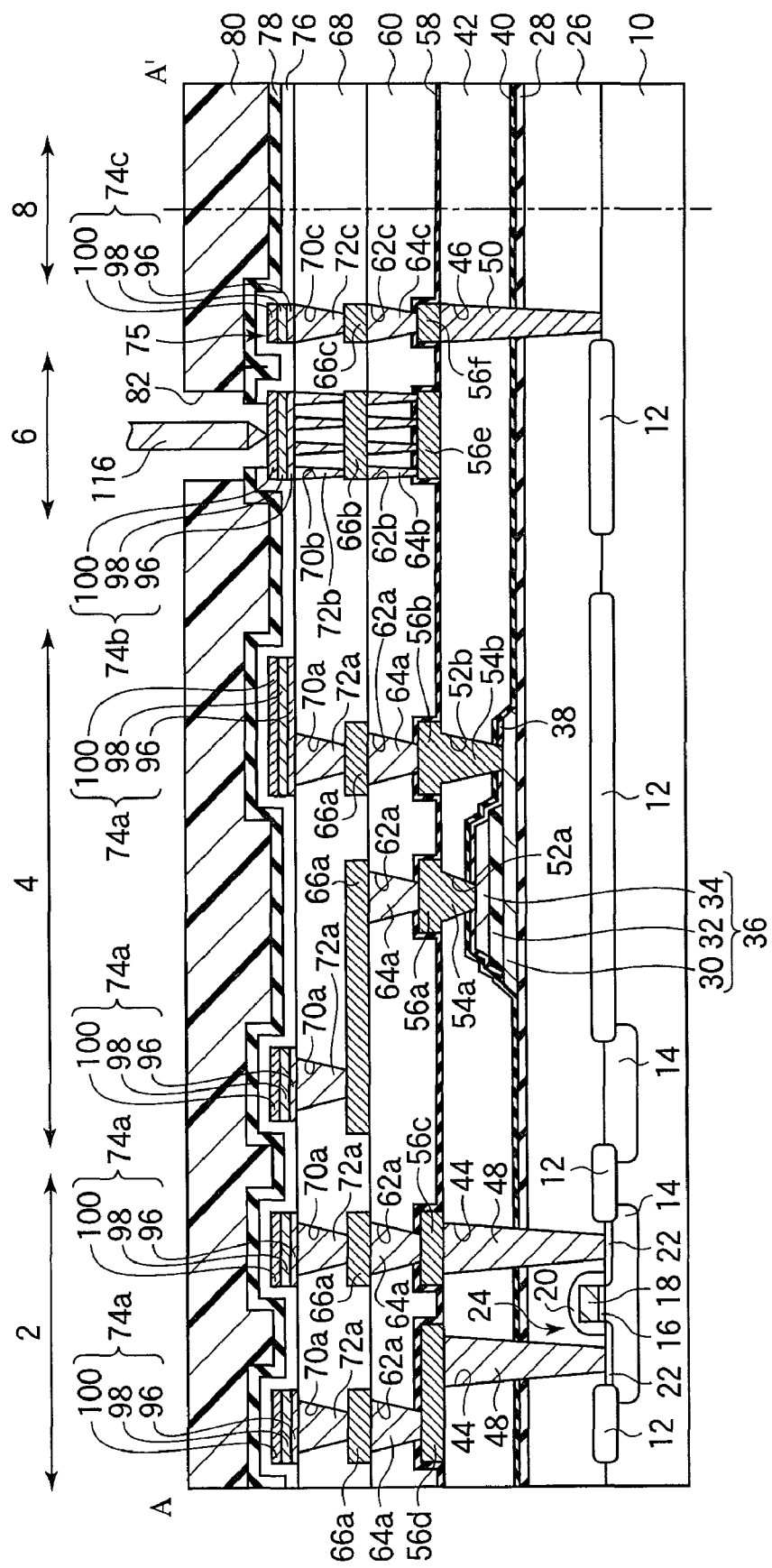
FIG. 6 is a sectional view of the semiconductor device according to the first embodiment in the steps of the method for manufacturing the semiconductor device, which illustrates the method (Part 5).
Figure 7:
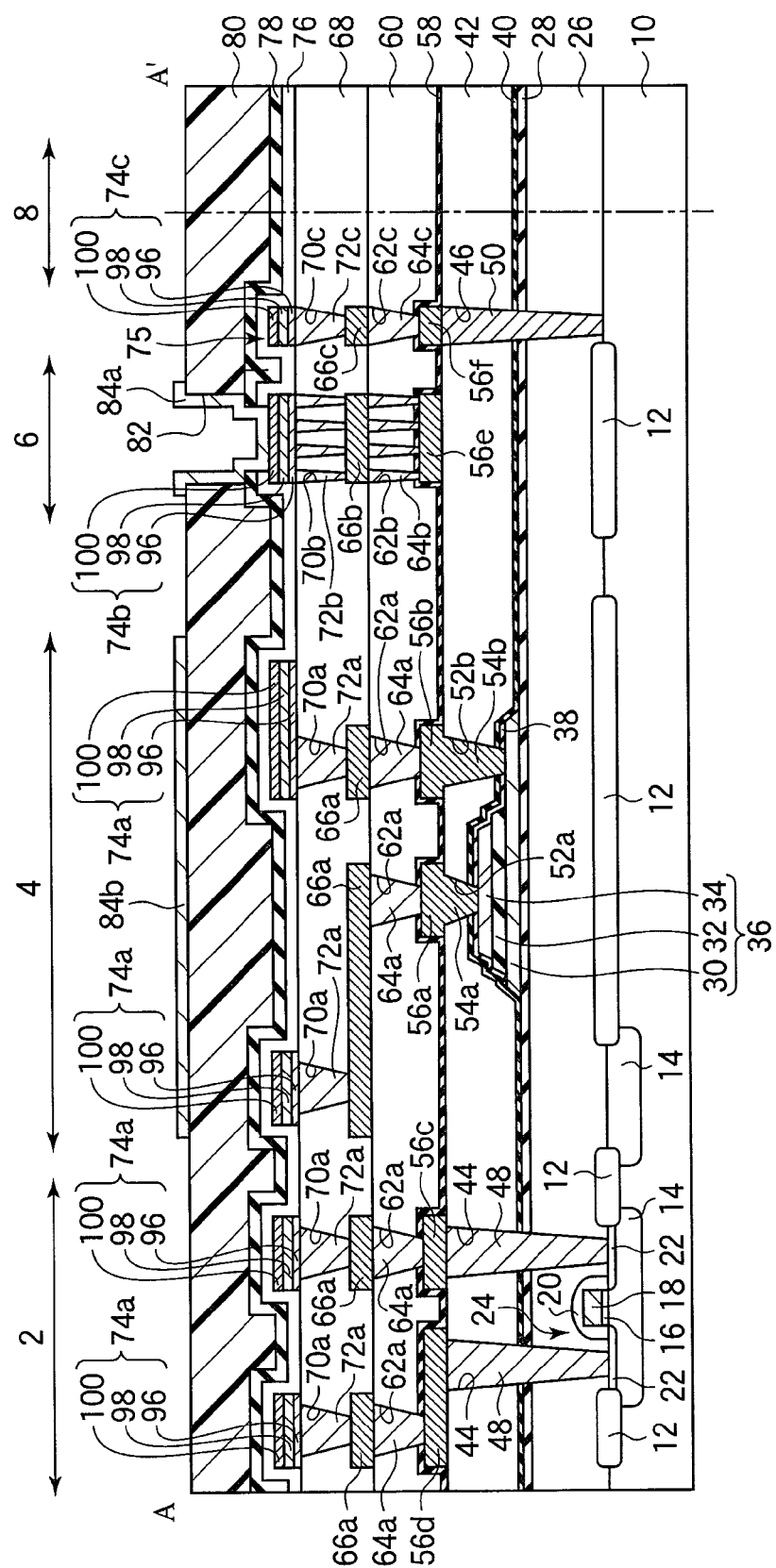
FIG. 7 is a sectional view of the semiconductor device according to the first embodiment in the steps of the method for manufacturing the semiconductor device, which illustrates the method (Part 6).

Next, as illustrated in FIG. 6, on the entire surface, the protection film 76 of, e.g., a 100 nm-thickness silicon oxide film is formed by, e.g., plasma TEOSCVD.

Next, on the entire surface, a protection film 78 of, e.g., a 350 nm-thickness silicon nitride film is formed by, e.g., plasma TEOS CVD.

Next, on the entire surface, a photoresist film (not illustrated) is formed by spin coating.

Next, by photolithography, openings (not illustrated) are formed in the photoresist film. The openings are for forming the contact holes 82 in the protection films 76, 78.

Next, with the photoresist film as the mask, the protection films 76, 78 are etched to form the openings 82 down to the electrode pads 74b.

Then, on the entire surface, the protection film 80 of, e.g., photosensitive polyimide is formed by spin coating. The film thickness of the protection film 80 is, e.g., about 3 μm.

Next, by photolithography, the openings 82 are formed in the protection film 80 down to the electrode pads 74b.

Then, thermal processing, e.g., 310° C. and 40 minutes is made in a nitrogen atmosphere. This thermal processing is for solidifying the protection film of polyimide. The flow rate of nitrogen gas to be fed into the chamber in the thermal processing is, e.g., 100 liters/minute. For the thermal processing, a vertical electric annealer, for example, is used.

Next, the probe 116 of a semiconductor test system is contacted to the electrode pads 74b to make required tests, etc. on the semiconductor device according to the present embodiment.

Next, on the entire surface, a 100-200 nm-thickness Ti film is formed by, e.g., sputtering. The film thickness of the Ti film here is, e.g., 150 nm.

Next, on the entire surface, a 250 nm-thickness palladium (Pd) film is formed by, e.g., sputtering. Thus, the conducting barrier film of the Ti film and the Pd film sequentially laid is formed. Pd film has the property of absorbing hydrogen. Accordingly, the conducting barrier film functions as a barrier film which prevents the intrusion of hydrogen, etc. The barrier film which is conductive is formed so as to ensure the conduction between the electrode pads 74b and the outside.

Then, the conducting barrier film is patterned by photolithography. Thus, the conducting barrier film 84a is formed in the opening 82 down to the electrode pad 74a. On the region where the capacitor part 36 is formed, i.e., on the FeRAM cell region 4, the conducting barrier film 84b is formed (see FIG. 7).

Then, the semiconductor wafer 10 is cut in the scribe region 8. The two-dot-chain line indicates the part where the semiconductor wafer 10 is to be cut.

Thus, the semiconductor device according to the present embodiment is manufactured.

A Second Embodiment

Figure 8:
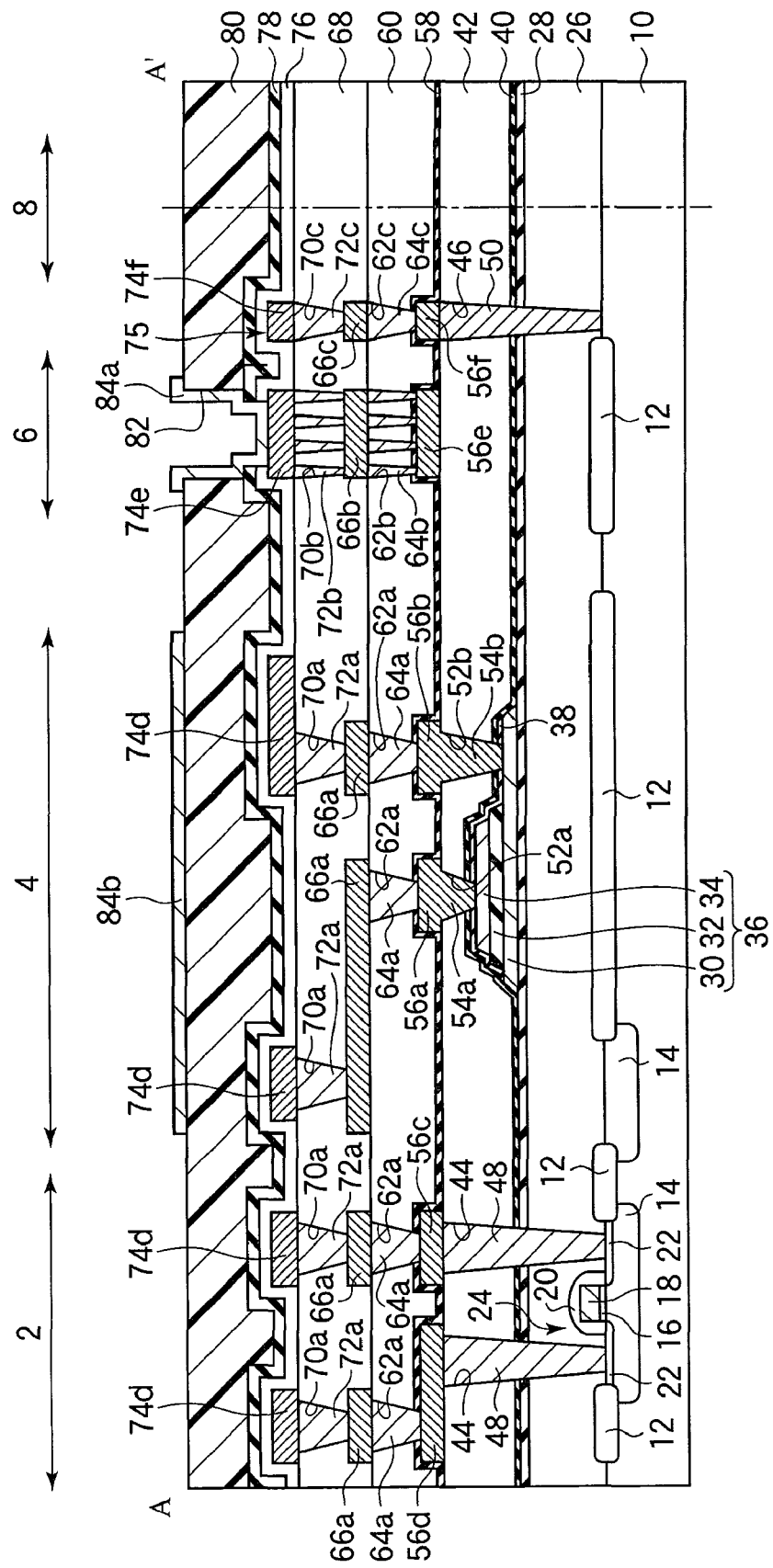
FIG. 8 is a sectional view of the semiconductor device according to a second embodiment.

The semiconductor device according to a second embodiment will be explained with reference to FIG. 8. FIG. 8 is a sectional view of the semiconductor device according to the present embodiment. The same members of the present embodiment as those of the semiconductor device according to the first embodiment and the method for manufacturing the semiconductor device illustrated in FIGS. 1A to 7 are represented by the same reference numbers will not be explained not to repeat or to simplify their explanation.

The semiconductor device according to the present embodiment is characterized mainly in that the electrode pads 74e are formed of a single layer of magnesium alloy film, i.e., the electrode pads 74e are formed of magnesium alloy film alone.

As illustrated in FIG. 8, on an inter-layer insulation film 68 with conductor plugs 72a buried in, interconnections 74d of, e.g., a 350-600 nm-thickness magnesium alloy film are formed. The film thickness of the magnesium alloy film forming the interconnections 74d here is, e.g., 500 nm.

On the inter-layer insulation film 68 with the conductor plugs 72b buried in, electrode pads 74e of a 350-600 nm-thickness magnesium alloy film are formed. The film thickness of the magnesium alloy film forming the electrode pads 74e here is, e.g., 500 nm.

On the inter-layer insulation film 68 with a metal layer 72c buried in, a metal layer 74f of a 350-600 nm-thickness magnesium alloy film is formed. The film thickness of the magnesium alloy film forming the metal layer 74f here is, e.g., 500 nm. The metal layer 50, the metal layer 56f, the metal layer 64c, the metal layer 66c, the metal layer 72c and the metal layer 74f form a seal ring 75.

According to the present embodiment, the electrode pads 74e, etc. are formed of a single layer of magnesium alloy film, which allows the manufacturing steps to be simplified in comparison with forming the electrode pads 74b, etc. of the layer film and may contribute to the cost reduction.

A Third Embodiment

Figure 9:
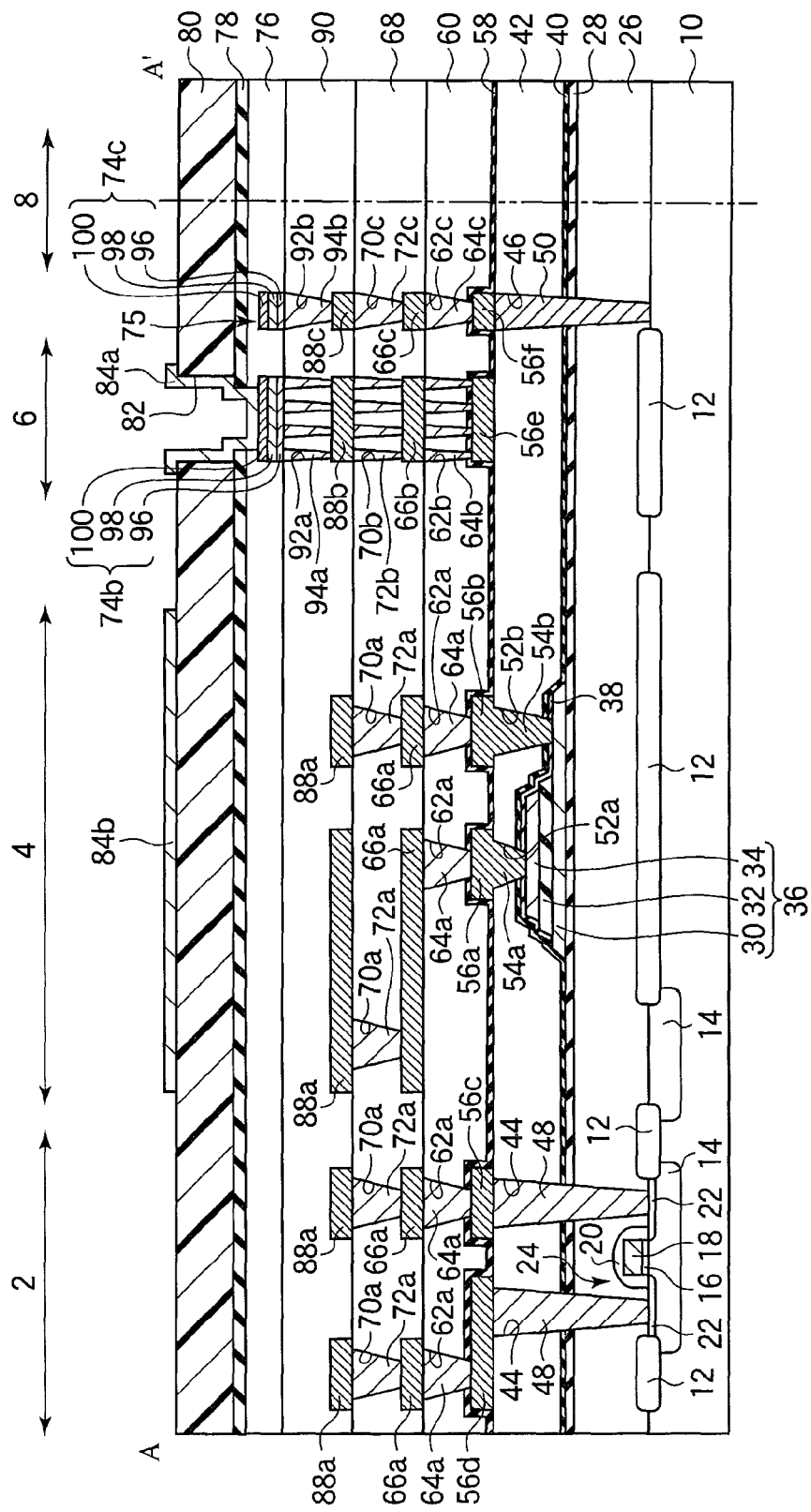
FIG. 9 is a sectional view of the semiconductor device according to a third embodiment.

The semiconductor device according to a third embodiment and the method for manufacturing the semiconductor device will be explained with reference to FIG. 9. FIG. 9 is a sectional view of the semiconductor device according to the present embodiment. The same members of the present embodiment as those of the semiconductor device according to the first or the second embodiment and the method for manufacturing the semiconductor device illustrated in FIGS. 1A to 8 are represented by the same reference numbers not to repeat or to simplify their explanation.

(The Semiconductor Device)

First, the semiconductor device according to the present embodiment and the method for manufacturing the semiconductor device will be explained with reference to FIG. 9.

The semiconductor device according to the present embodiment is characterized mainly in that electrode pads 74b are formed on a layer upper of interconnections (the third metal interconnection layer) 88a.

As illustrated in FIG. 9, on an inter-layer insulation film 68 with conductor plugs 72a, 72b and a metal layer 72c buried in, interconnections (the third metal interconnection layer) 88a, electrodes 88b and a metal layer 88c are formed. The interconnections 88a are connected to the conductor plugs 72a, as are the interconnections 74a of the first embodiment illustrated in FIGS. 1A and 1B. The electrodes 88b are formed in a plane shape, as are the electrode pads 74a. The metal layer 88c forms a part of a seal ring 75. As the material of the interconnections 88a, the electrodes 88b and the metal layer 88c, Al—Cu alloy, for example, is used.

On the inter-layer insulation film 68 with the interconnections 88a, the electrodes 88b and the metal layer 88c formed on, an inter-layer insulation film 90 of, e.g., silicon oxide film is formed.

In the inter-layer insulation film 90, contact holes 92a are formed down to the electrodes 88b. In the inter-layer insulation film 90, a contact hole 92b is formed down to the metal layer 88c.

In the contact holes 92a, conductor plugs 94a of, e.g., tungsten are buried. In the contact hole 92b, the metal layer 94b of, e.g., tungsten is buried. The metal layer 94b forms a part of the seal ring 75.

On the inter-layer insulation film 90 with the conductor plugs 94a and the metal layer 94b buried in, electrode pads 74b and the metal layer 74c are formed. As the material of the electrode pads 74b and the metal layer 74c, the layer film of a TiN film 96, an Al—Cu alloy film 98 and a magnesium alloy film 100 is used, as in the semiconductor device according to the first embodiment.

The electrode pads 74b and the metal layer 74c may be formed of a magnesium alloy film 100 alone, as in the semiconductor device according to the second embodiment.

On the inter-layer insulation film 90 with the electrode pads 74b and the metal layer 74c formed on, a protection film 76 of, e.g., silicon oxide film is formed.

On the protection film 76, a protection film 78 of, e.g., a silicon nitride film is formed.

In the protection films 76, 78, openings 82 are formed down to the electrode pads 74b.

On the protection film 78, a protection film 80 of, e.g., polyimide is formed.

In the protection film 80, openings 82 are formed down to the electrode pads 74b.

In the openings 82 and on the FeRAM cell region 4, conducting barrier films 84a, 84b are formed.

Thus, the semiconductor device according to the present embodiment is constituted.

As in the present embodiment, the electrode pads 74b may be formed in the layer upper of the interconnections (the third metal interconnection layer) 88a.

(The Method for Manufacturing the Semiconductor Device)

Then, the method for manufacturing the semiconductor device according to the present embodiment will be explained with reference to FIGS. 10 to 13. FIGS. 10 to 13 are sectional views of the semiconductor device according to the present embodiment in the steps of the method for manufacturing the semiconductor device, which explain the method.

First, the step of forming the device isolation region 12 for defining the device region in the semiconductor substrate 10 of, e.g., silicon to the step of forming the interconnections 66, the electrodes 66b and the metal layer 66c on the inter-layer insulation film 60 are the same as those of the method for manufacturing the semiconductor device according to the first embodiment described above with reference to FIG. 2A to FIG. 5A, and their explanation will not be repeated.

Figure 10:
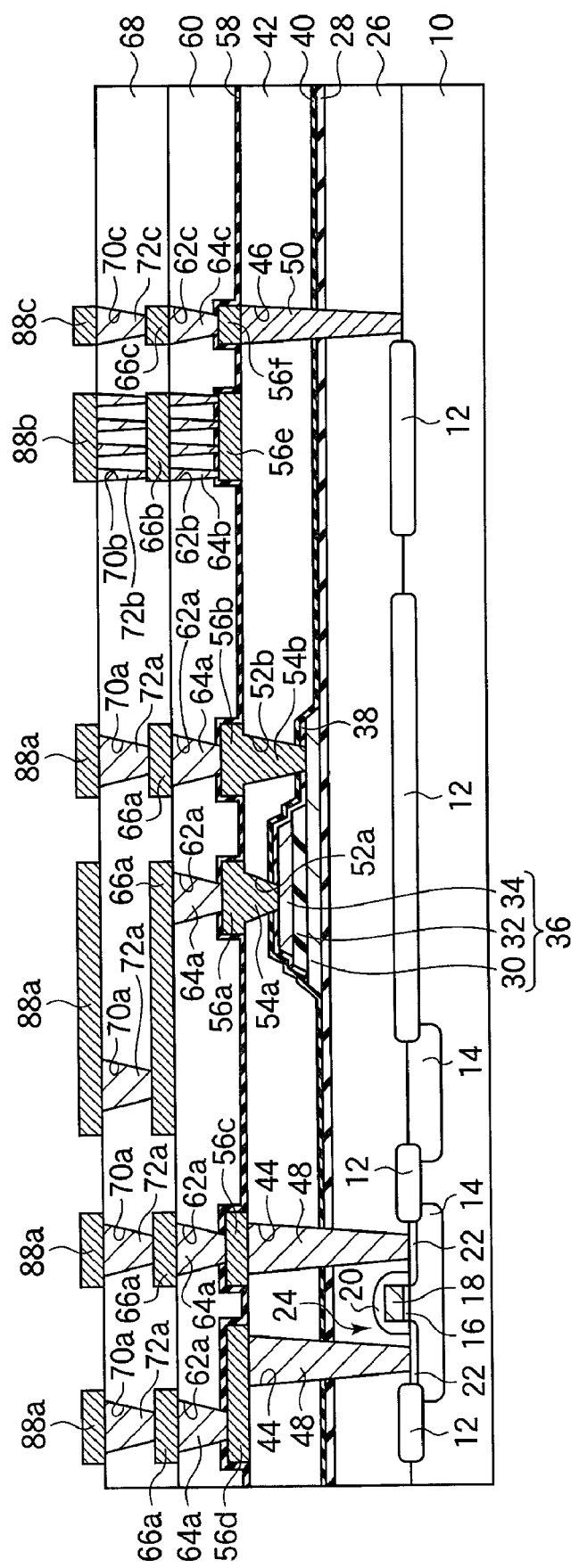
FIG. 10 is a sectional view of the semiconductor device according to the third embodiment in the steps of the method for manufacturing the semiconductor device, which illustrates the method (Part 1).
Figure 11:
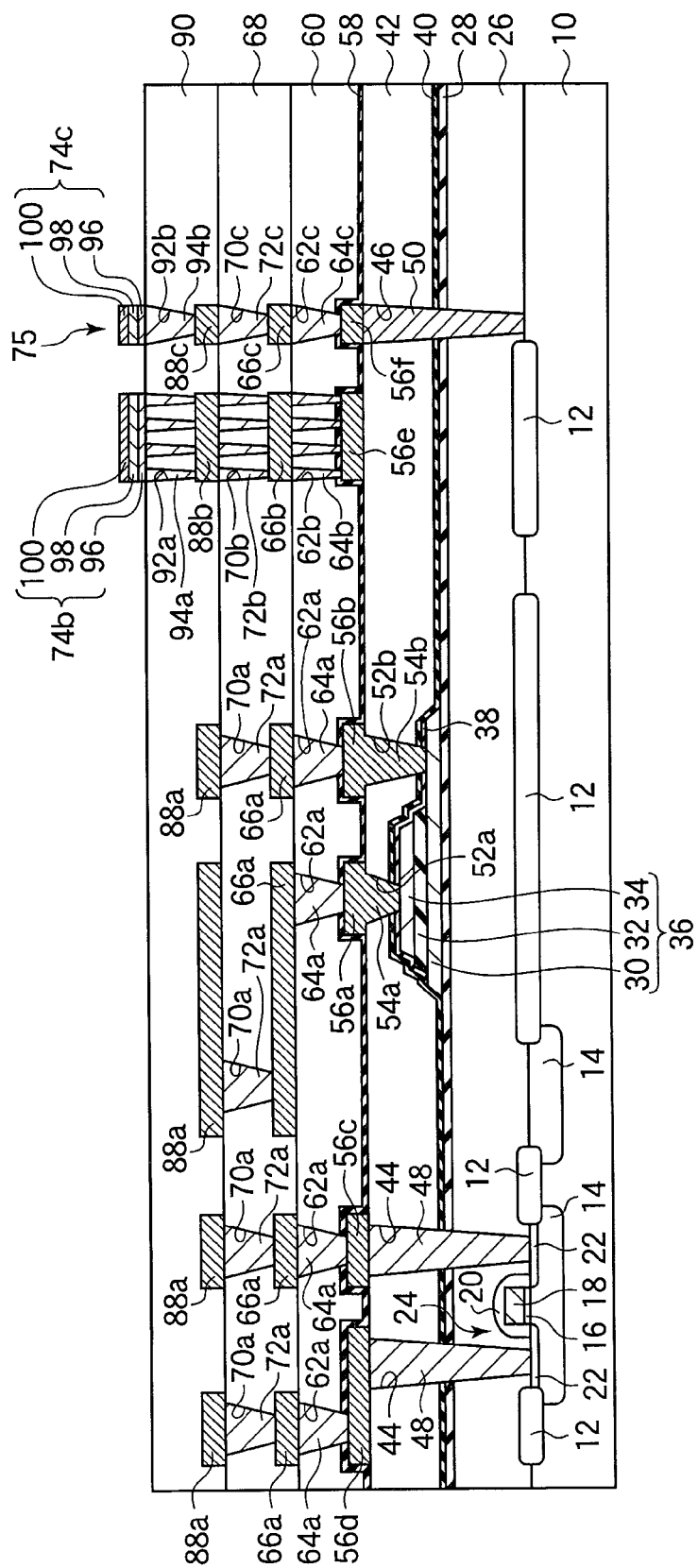
FIG. 11 is a sectional view of the semiconductor device according to the third embodiment in the steps of the method for manufacturing the semiconductor device, which illustrates the method (Part 2).

Next, in the same way as in the method for manufacturing the semiconductor device according to the first embodiment described above, the inter-layer insulation film 68 is formed on the entire surface (see FIG. 10).

In the same way as in the method for manufacturing the semiconductor device according to the first embodiment described above, the contact holes 70a, the contact holes 70b and the contact hole 70c are formed in the inter-layer insulation film 68 respectively down to the interconnections 66a, down to the electrodes 66b and down to the metal layer 66c.

Next, in the same way as in the method for manufacturing the semiconductor device according to the first embodiment described above, the conductor plugs 72a, 72b of tungsten are buried in the contact holes 70a, 70b, and in the opening 70c, the metal layer 72c of tungsten is buried.

Next, on the entire surface, the 550 nm-thickness Al—Cu alloy film and the 5 nm-thickness Ti film and the 150 nm-thickness TiN film are sequentially formed by, e.g., PVD.

Thus, the layer film of the Al—Cu alloy film, the Ti film and the TiN film is formed.

Then, by photolithography, the layer film is patterned. Thus, the interconnections 88a and the electrodes 88b and the metal layer 88c of the layer film are formed.

Next, on the entire surface, by, e.g., plasma TEOS CVD, the 2200 nm-thickness silicon oxide film (not illustrated) is formed.

Then, the surface of the silicon oxide film is planarized by, e.g., CMP.

Next, thermal processing is made in a plasma atmosphere generated with $N_2O$ gas (plasma annealing). The plasma annealing is for removing water present inside the silicon oxide film and nitriding the surface of the silicon oxide film. The plasma annealing may be made with, e.g., a CVD system. The conditions for the plasma annealing are, e.g., 350° C. and 4 minutes.

Then, on the entire surface, the 100 nm-thickness silicon oxide film (not illustrated) is formed by, e.g., plasma TEOS CVD.

Then, thermal processing is made in a plasma atmosphere generated with $N_2O$ gas (plasma annealing). The plasma annealing is for removing water present inside the silicon oxide film and nitriding the surface of the silicon oxide film. The plasma annealing may be made with, e.g., a CVD system. The conditions for the plasma annealing are, e.g., 350° C. and 2 minutes. Thus, the inter-layer insulation film 90 of the silicon oxide film and the silicon oxide film is formed (see FIG. 11).

Next, by photolithography, the contact holes 92a and the opening 92b are formed in the inter-layer insulation film 90 respectively down to the interconnections 88b and down to the metal layer 88c.

Then, on the entire surface, the barrier metal film (not illustrated) of a 50 nm-thickness TiN film is formed by, e.g., PVD.

Then, on the entire surface, a 650 nm-thickness tungsten film is formed by, e.g., CVD.

Then, the tungsten film and the barrier metal film are etched back until the surface of the inter-layer insulation film is exposed. Thus, in the contact holes 92a, the conductor plugs 94a of tungsten are buried. In the opening 92b, the metal layer 94b of tungsten is buried.

The tungsten film and the barrier metal film may be polished by CMP until the surface of the inter-layer insulation film 90 is exposed so as to form the conductor plugs 94a and the metal layer 94b.

Then, on the entire surface, a 50 nm-thickness TiN film 96, for example, is formed by, e.g., PVD. The TiN film 96 is for preventing the diffusion of the tungsten used in the conductor plugs 94a and the metal layer 94b into the Al—Cu alloy film 98.

Next, on the entire surface, a 250 nm-thickness Al—Cu alloy film 98, for example, is formed by, e.g., PVD.

Next, on the entire surface, a 300 nm-thickness magnesium alloy film 100, for example, is formed by, e.g., PVD. As describe above, the content ratio (composition) of Al of the magnesium alloy film 100 is preferably 1-20 weight %, more preferably 2-10 weight %.

Thus, the TiN film 96, the Al—Cu alloy film 98 and the magnesium alloy film 100 form the layer film. The layer film is to be the electrode pads 74b and the metal layer 74c.

Then, on the entire surface, a photoresist film (not illustrated) is formed by spin coating.

Next, by photolithography, the photoresist film is patterned into the plane shapes of the electrode pads 74b and the metal layer 74c.

Then, with the photoresist film as the mask, the layer film is etched by sputter etching using, e.g., argon ions. The conditions for etching the layer film are the same as those of the method for manufacturing the semiconductor device according to the first embodiment.

Thus, the electrode pads 74b and the metal layer 74c are formed of the layer film. The metal layer 50, the metal layer 56f, the metal layer 64c, the metal layer 66c, the metal layer 72c, the metal layer 88c, the metal layer 94b and the metal layer 74c form the seal ring 75. Then, the photoresist film is released.

Figure 12:
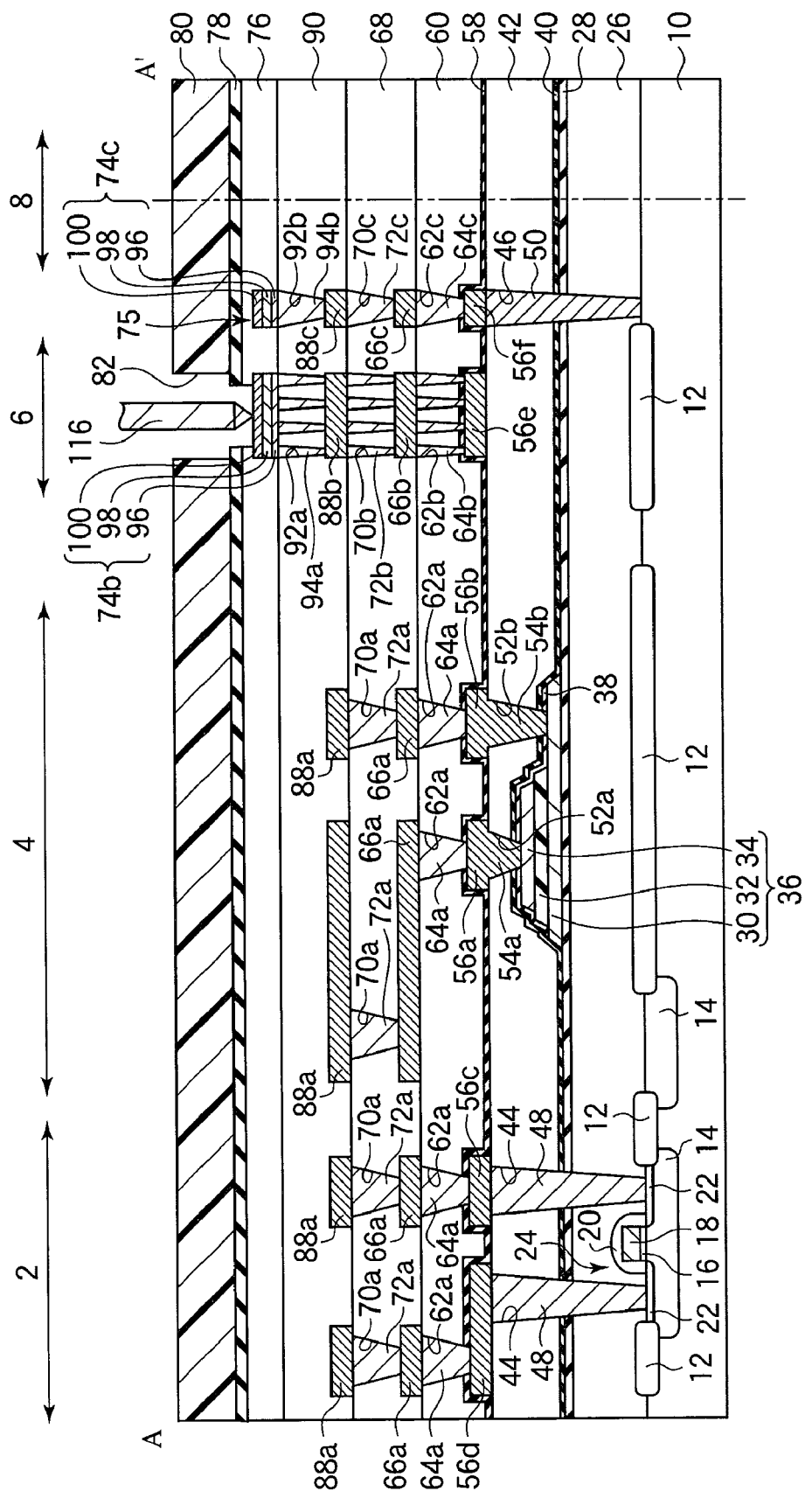
FIG. 12 is a sectional view of the semiconductor device according to the third embodiment in the steps of the method for manufacturing the semiconductor device, which illustrates the method (Part 3).

Then, as illustrated in FIG. 12, the protection film 76 of, e.g., a 100 nm-thickness silicon oxide film is formed on the entire surface by, e.g., plasma TEOS CVD.

Next, on the entire surface, the protection film 78 of, e.g., a 350 nm-thickness silicon nitride film is formed by, e.g., plasma TEOS CVD.

Next, on the entire surface, a photoresist film (not illustrated) is formed by spin coating.

Next, by photolithography, openings (not illustrated) are formed in the photoresist film. The openings are for forming the contact holes 82 in the protection films 76, 78.

Then, with the photoresist film as the mask, the protection films 76, 78 are etched to thereby form the openings 82 down to the electrode pads 74b.

Next, on the entire surface, the protection film 80 of, e.g., photosensitive polyimide is formed by spin coating. The film thickness of the protection film 80 is, e.g., about 3 μm.

Next, by photolithography, the openings 82 are formed in the protection film 80 down to the electrode pads 74b.

Then, thermal processing, e.g., of 310° C. and 40 minutes is made in a nitrogen atmosphere. This thermal processing is for solidifying the protection film 80 of polyimide. The flow rate of nitrogen gas to be fed into the chamber in the thermal processing is, e.g., 100 liters/minute. For the thermal processing, a vertical electric annealer, for example, is used. Then, the probe 116 of a semiconductor test system is contacted to the electrode pads 74b to make required tests, etc. on the semiconductor device according to the present embodiment.

The method for manufacturing the semiconductor device hereafter is the same as the method for manufacturing the semiconductor device according to the first embodiment described above with reference to FIG. 7, and its explanation will not be repeated.

Figure 13:
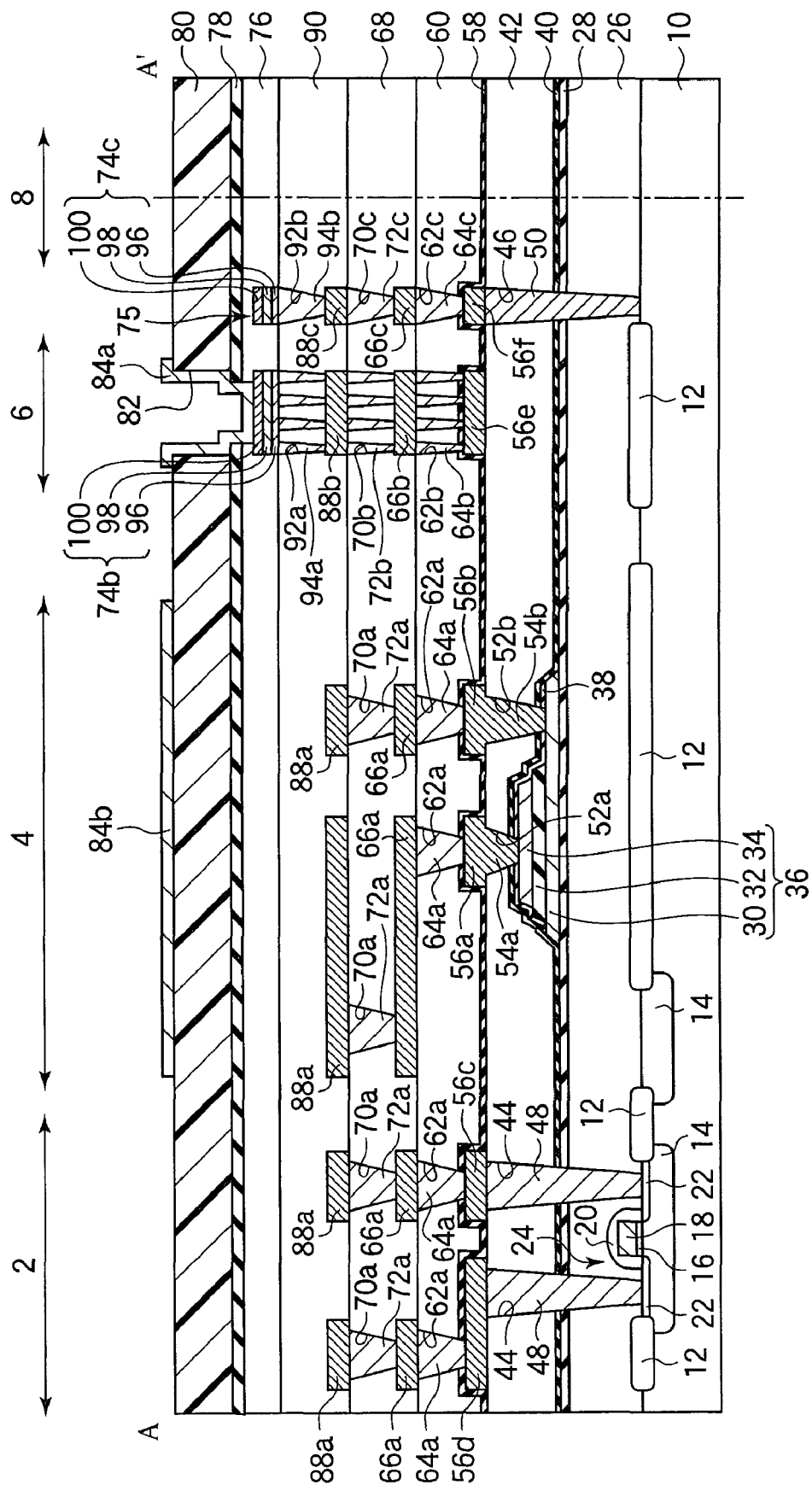
FIG. 13 is a sectional view of the semiconductor device according to the third embodiment in the steps of the method for manufacturing the semiconductor device, which illustrates the method (Part 4).

Thus, the semiconductor device according to the present embodiment is manufactured (see FIG. 13).

A Fourth Embodiment

Figure 14A:
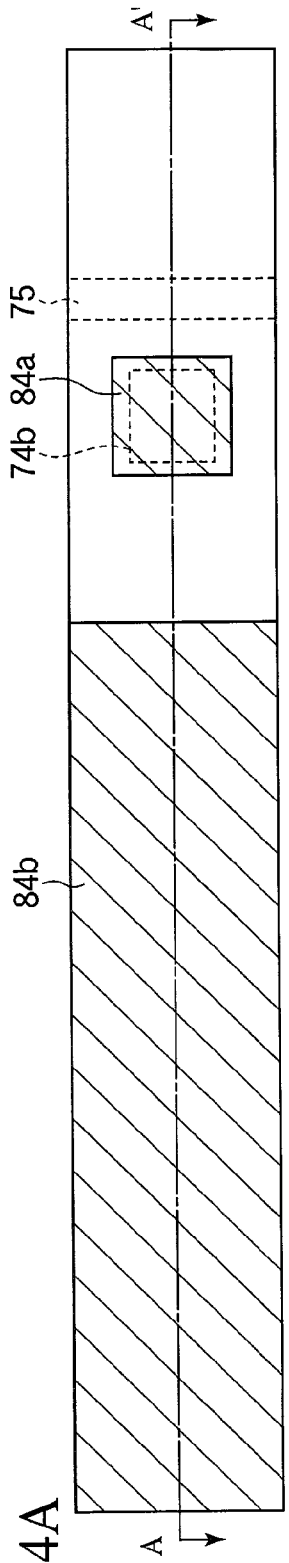
FIGS. 14A and 14B are a plan view and a sectional view of the semiconductor device according to the fourth embodiment.
Figure 14B:
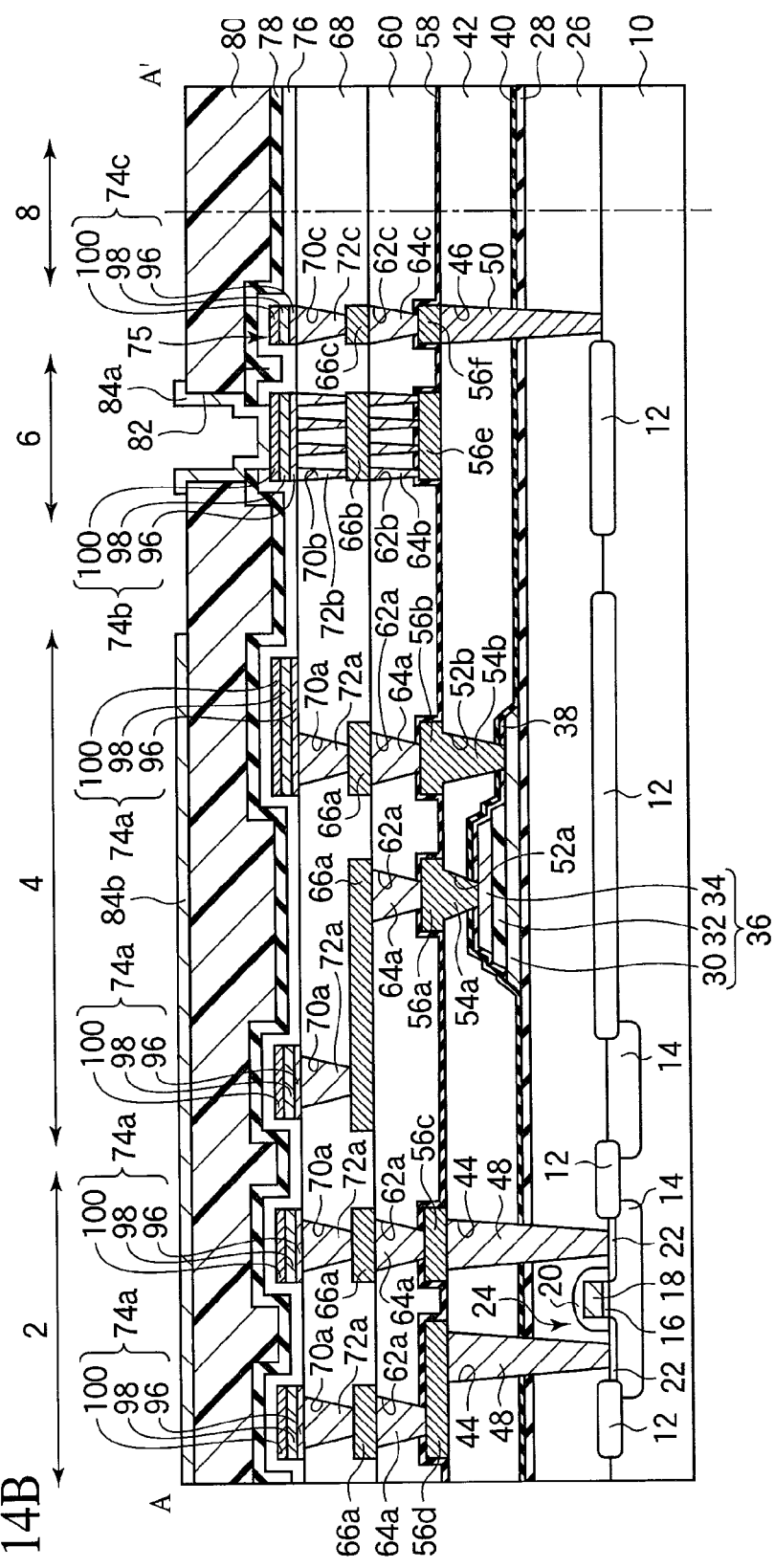

The semiconductor device according to a fourth embodiment will be explained with reference to FIGS. 14A and 14B. FIGS. 14A and 14B are a plan view and a sectional view of the semiconductor device according to the present embodiment. FIG. 14A is the plan view, and FIG. 14B is the sectional view along the A-A' line in FIG. 14A. The same members of the present embodiment as those of the semiconductor device according to the first to the third embodiments and the method for manufacturing the semiconductor device illustrated in FIGS. 1A to 13 are represented by the same reference numbers not to repeat or to simplify their explanation.

The semiconductor device according to the present embodiment is characterized mainly in that the conducting barrier film 84b is formed wide, covering not only the FeRAM cell part (memory cell region) 4 but also the logic part (peripheral circuit region) 2.

As illustrated in FIGS. 14A and 14B, in an opening 82, a conducting barrier film 84*a* is formed.

On a protection film 80, a conducting barrier film 84*b* of one and the same conduction film as the conducting barrier film 84*a* is formed. The conducting barrier film 84*b* is formed, covering not only in the FeRAM cell part (memory cell region) 4 but also in the logic part 2. The conducting barrier film 84*a* formed in the opening 82 and the conducting barrier film 84*b* formed covering the FeRAM cell part 4 and the logic cell part (peripheral circuit region) 2 are isolated from each other and are surely insulated from each other.

According to the present embodiment, the conducting barrier film 84*b* is formed, covering not only the FeRAM cell part 4 and also the logic part 2, whereby the arrival of hydrogen and water at the dielectric film 32 of the capacitor 36 may be more surely prevented.

A Fifth Embodiment

Figure 15A:
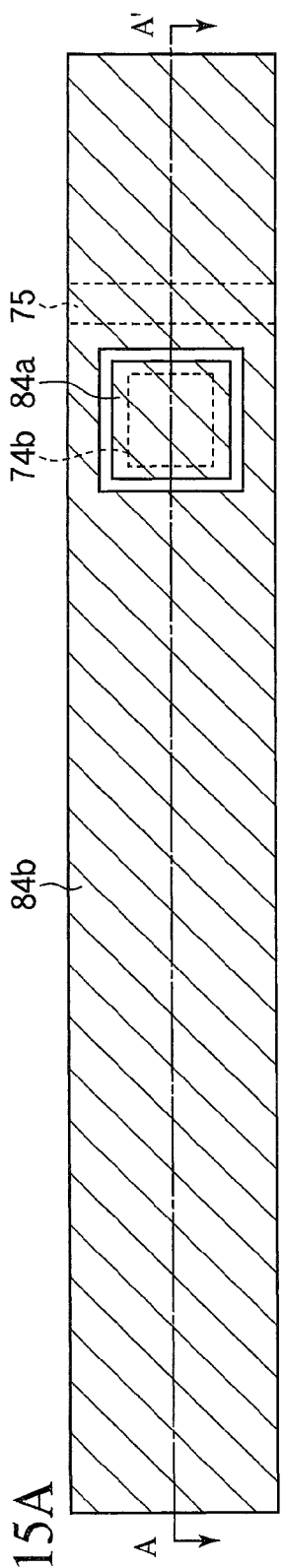
FIGS. 15A and 15B are a plan view and a sectional view of the semiconductor device according to a fifth embodiment.
Figure 15B:
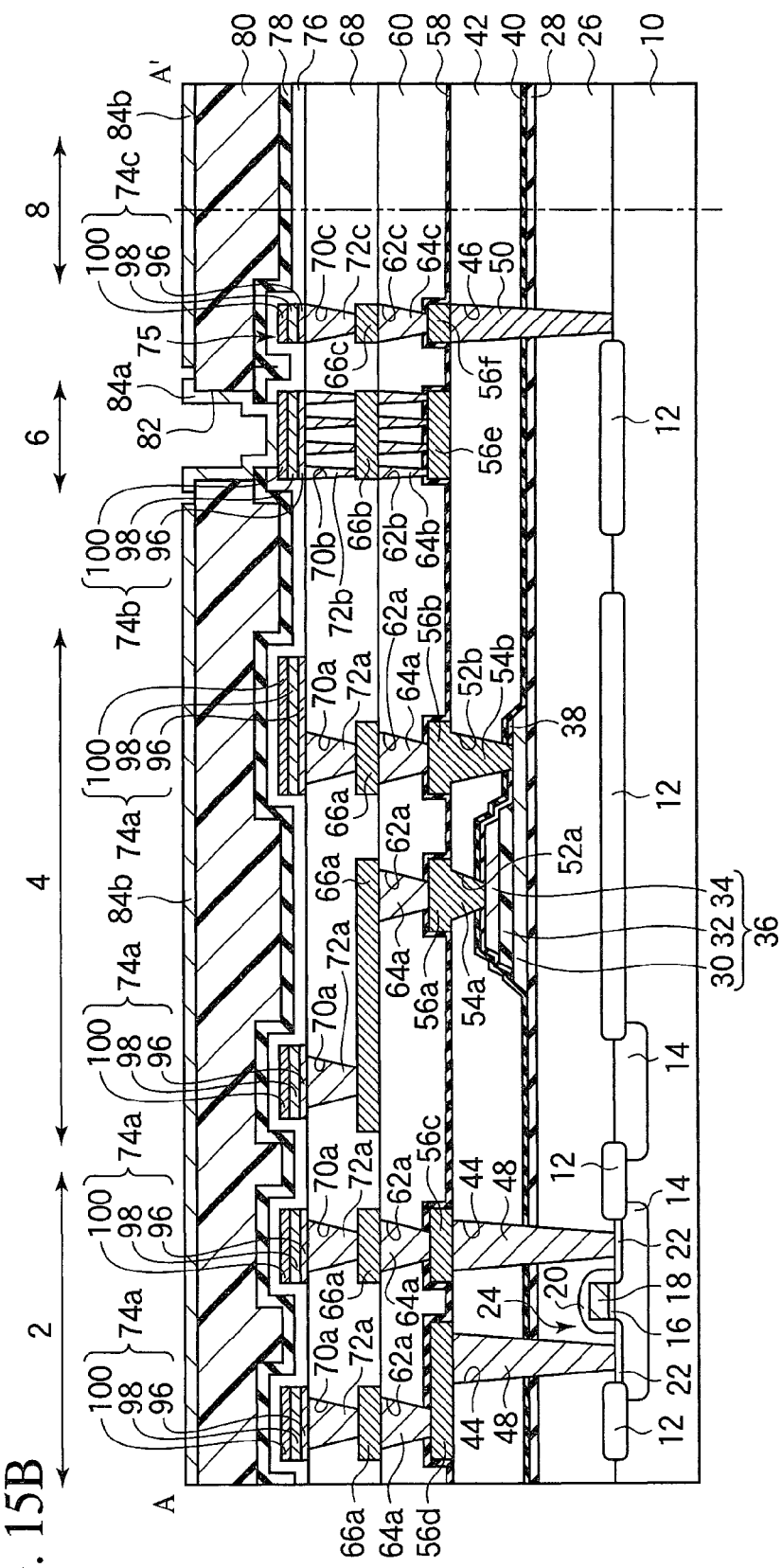

The semiconductor device according to a fifth embodiment will be explained with reference to FIGS. 15A and 15B. FIGS. 15A and 15B are a plan view and a sectional view of the semiconductor device according to the present embodiment. FIG. 15A is the plan view and FIG. 15B is the sectional view along the A-A' line in FIG. 15A. The same members of the present embodiment as those of the semiconductor device according to the first to the fourth embodiment and the method for manufacturing the semiconductor device illustrated in FIGS. 1A to 14B are represented by the same reference numbers not to repeat or to simplify their explanation.

The semiconductor device according to the present embodiment is characterized mainly in that a conducting barrier film 84*b* is formed wide in the region except the electrode pad part 6. In other words, the semiconductor device according to the present embodiment is characterized mainly in that the conducting barrier film 84*b* is formed, covering the whole except the region where the conducting barrier film 84*a* is formed.

As illustrated in FIGS. 15A and 15B, in an opening 82, the conducting barrier film 84*a* is formed.

On a protection film 80, a conducting barrier film 84*b* of one and the same conducting barrier film 84*a* is formed. The conducting barrier film 84*b* is formed flat wide in the region except the electrode pad part 6. However, the conducting barrier film 84*a* formed in the electrode pad part 6 and the conducting barrier film 84*b* formed solid on the protection film 80 are isolated from each other and are surely insulated from each other.

According to the present embodiment, the conducting barrier film 84*b* is formed wide in the region except the electrode pad part 6, whereby the arrival of hydrogen and water at the dielectric film 32 of the capacitors 36 may be surely prevented.

A Sixth Embodiment

Figure 16A:
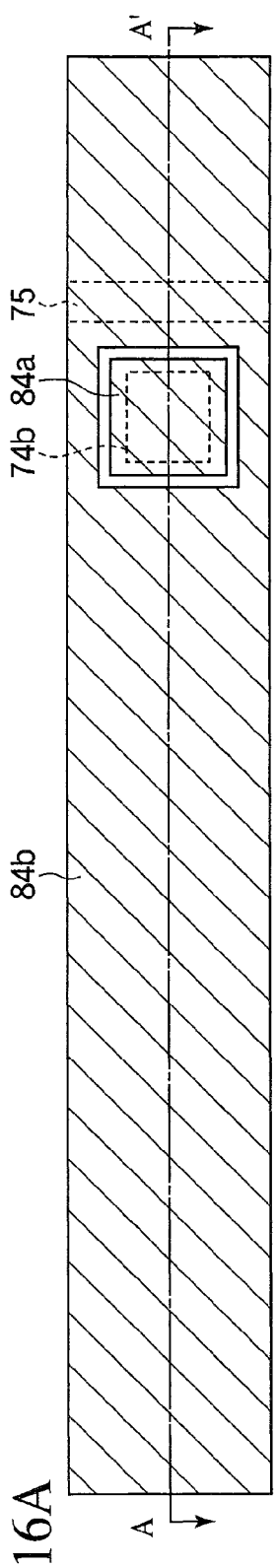
FIGS. 16A and 16B are a plan view and a sectional view of the semiconductor device according to a sixth embodiment.
Figure 16B:
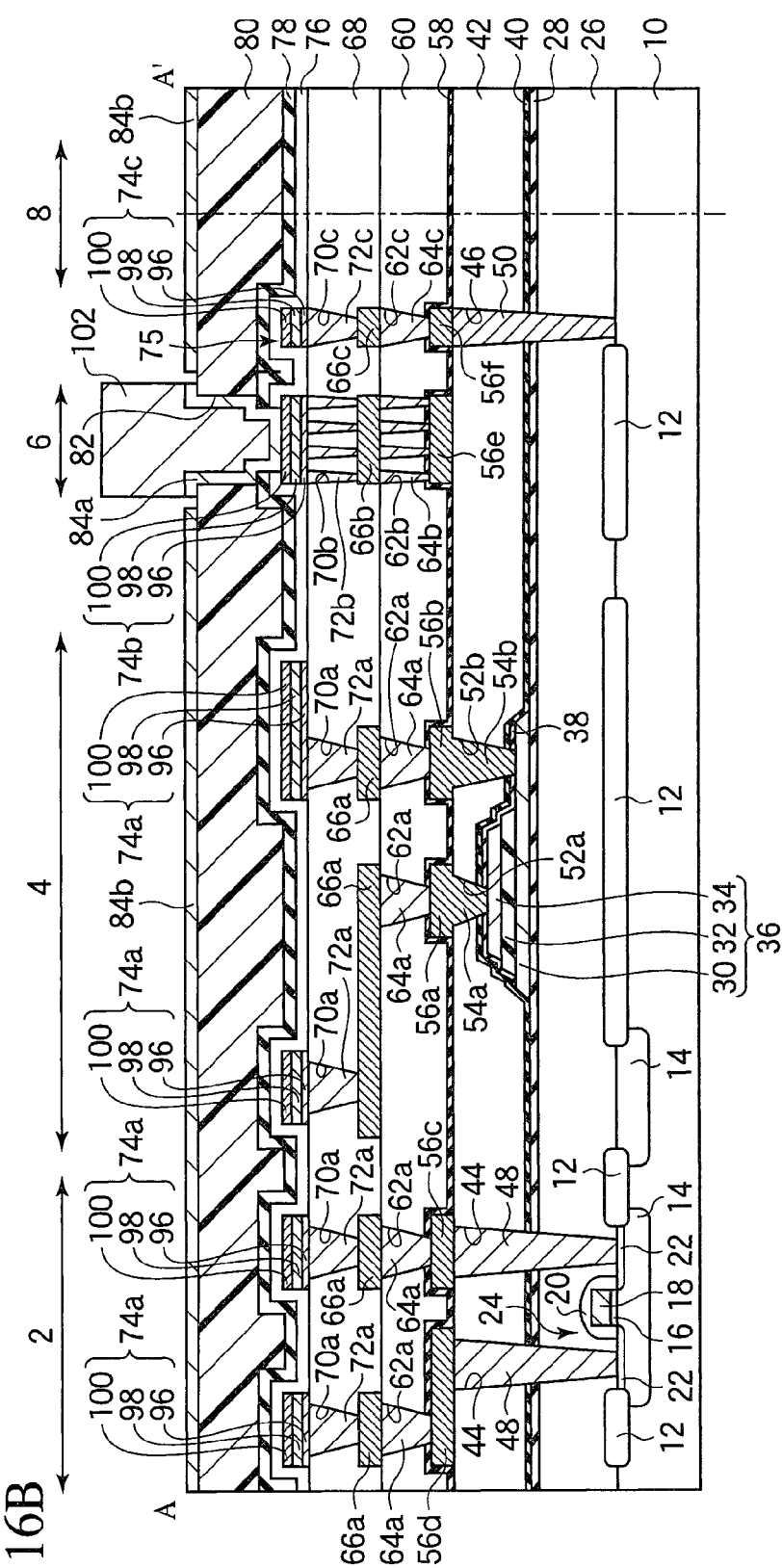

The semiconductor device according to a sixth embodiment will be explained with reference to FIGS. 16A and 16B. FIGS. 16A and 16B are a plan view and a sectional view of the semiconductor device according to the present embodiment. FIG. 16A is the plan view, and FIG. 16B is the sectional view along the A-A' line in FIG. 16A. The same members of the present embodiment as those of the semiconductor device according to the first to the fifth embodiment and the method for manufacturing the semiconductor device illustrated in FIGS. 1A to 15B are represented by the same reference numbers not to repeat or to simplify their explanation.

The semiconductor device according to the present embodiment is characterized mainly in that bump electrode 102 are formed on a conducting barrier film 84*a* formed in the electrode pad part 6.

As illustrated in FIGS. 16A and 16B, on the conducting barrier film 84*a* of the electrode pad part 6, the bump electrodes 102 of, e.g., gold (Au) are formed. The bump electrodes 102 may considerably suppress the intrusion of hydrogen and water from the outside.

According to the present embodiment, the bump electrodes 102 are further formed on the conducting barrier film 84 of the electrode pad part 6, whereby the intrusion of hydrogen and water may be further surely prevented.

A Seventh Embodiment

Figure 17A:
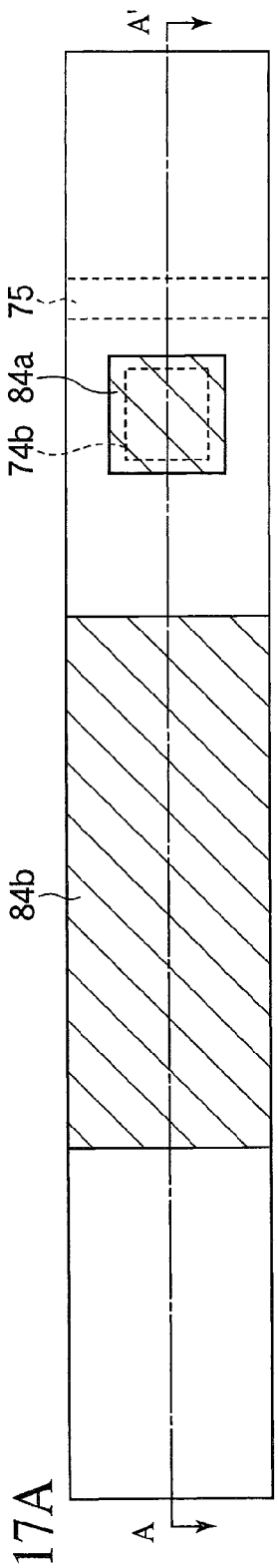
FIGS. 17A and 17B are a plan view and a sectional view of the semiconductor device according to a seventh embodiment.
Figure 17B:
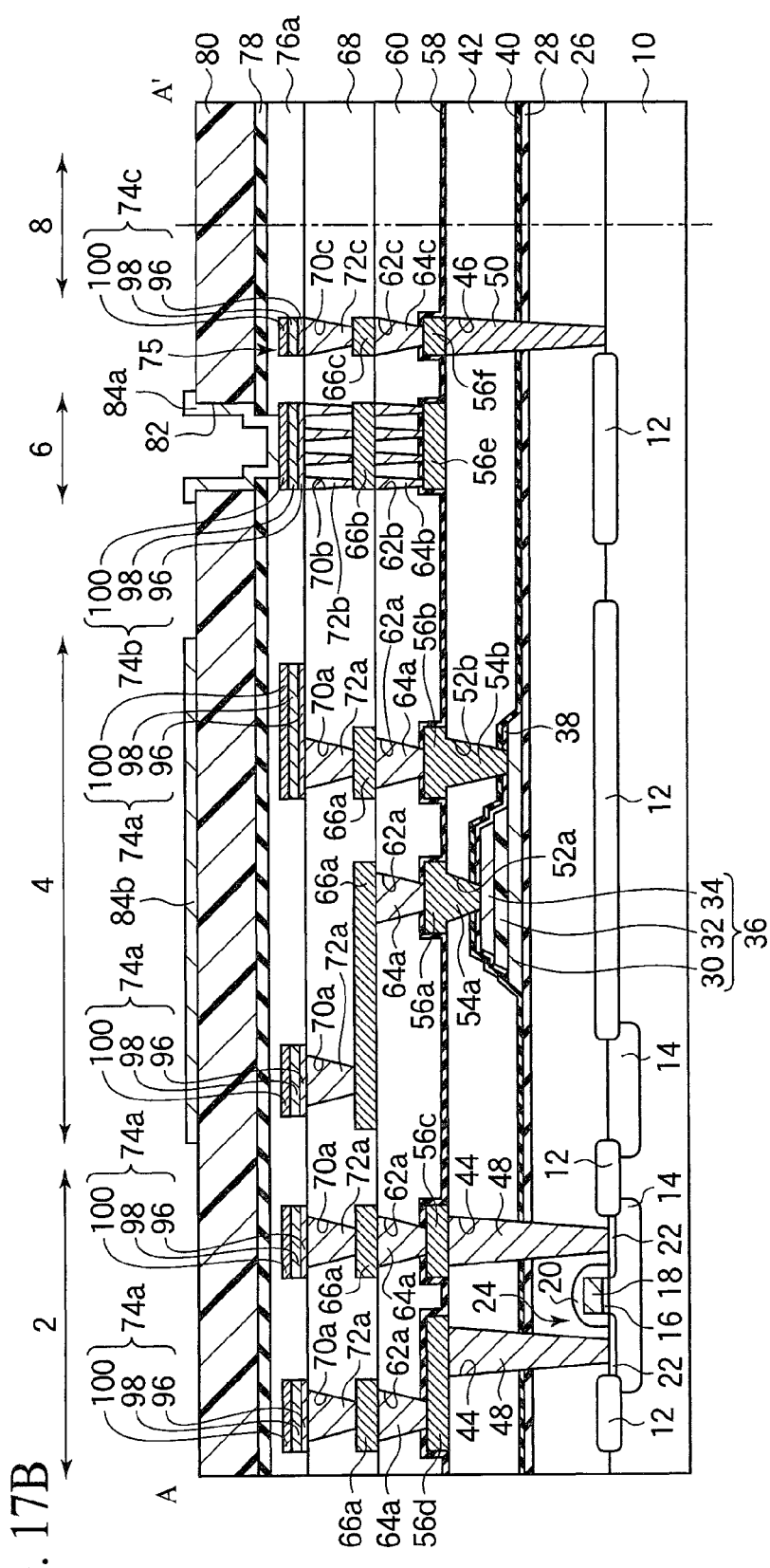

The semiconductor device according to a seventh embodiment will be explained with reference to FIGS. 17A and 17B. FIGS. 17A and 17B are a plan view and a sectional view of the semiconductor device according to the present embodiment. FIG. 17A is the plan view, and FIG. 17B is the sectional view along the A-A' line in FIG. 17A. The same members of the present embodiment as those of the semiconductor device according to the first to the sixth embodiments and the method for manufacturing the semiconductor device illustrated in FIGS. 1A to 16B are represented by the same reference numbers not to repeat or to simplify their explanation.

The semiconductor device according to the present embodiment is characterized mainly in that the surface of a protection film 76*a* of silicon oxide film is planarized, and on the planarized protection film 76*a*, a protection film 78 of silicon nitride film is formed.

As illustrated in FIGS. 17A and 17B, in the present embodiment, the surface of the protection film 76*a* of silicon oxide film is planarized. The protection film 76*a* may be formed by forming, e.g. a 2000 nm-thickness silicon oxide film and then polishing the surface of the silicon oxide film by CMP.

On the protection film 76*a* of silicon oxide film, the protection film 78 of silicon nitride film is formed. The protection film 78, which is formed on the planarized protection film 76*a*, is planarized. The protection film 78 of silicon nitride film is for preventing the diffusion of water. More specifically, the protection film 78 prevents the arrival of water contained in the protection film 80 at the inter-layer insulation film 68, etc. and resultantly preventing the arrival of the water at the dielectric film 32 of the capacitors 36.

On the protection film 80 above the region where the capacitors 36 are formed, i.e., in the FeRAM cell region 4, a conducting barrier film 84*b* is formed solid.

Thus, the semiconductor device according to the present embodiment is constituted.

The semiconductor device according to the present embodiment is characterized mainly in that, as described above, the protection film 78 of silicon nitride film is formed flat on the planarized protection film 76*a*.

In the case that the protection film 76 of silicon oxide film alone is formed on the inter-layer insulation film 68 with the interconnections 74*a*, the electrodes 74*b* and the metal layer 74*c* formed on, as exemplified in FIGS. 1A and 1B, the steps are formed as exemplified in FIGS. 1A and 1B. When the protection film 78 of silicon nitride film is formed on the protection film 76 having the steps in the surface, good coverage may not be provided at the steps. Resultantly, it is difficult for the protection film 78 to sufficiently prevent the diffusion of water at the steps.

In the present embodiment, the protection film 78 of silicon nitride film is formed on the planarized protection film 76a, whereby the protection film 78 may have good coverage. According to the present embodiment, the diffusion of water may be more surely prevented by the protection film 78.

An Eighth Embodiment

Figure 18A:
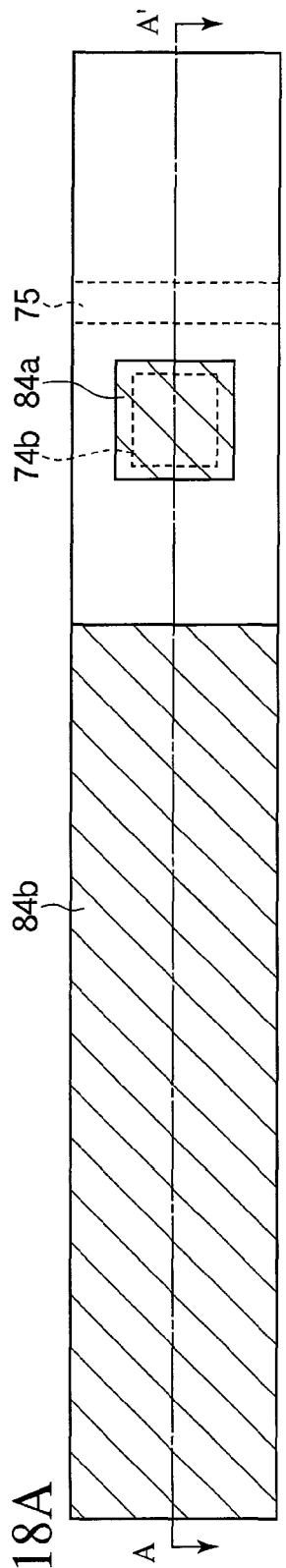
FIGS. 18A and 18B are a plan view and a sectional view of the semiconductor device according to an eighth embodiment.
Figure 18B:
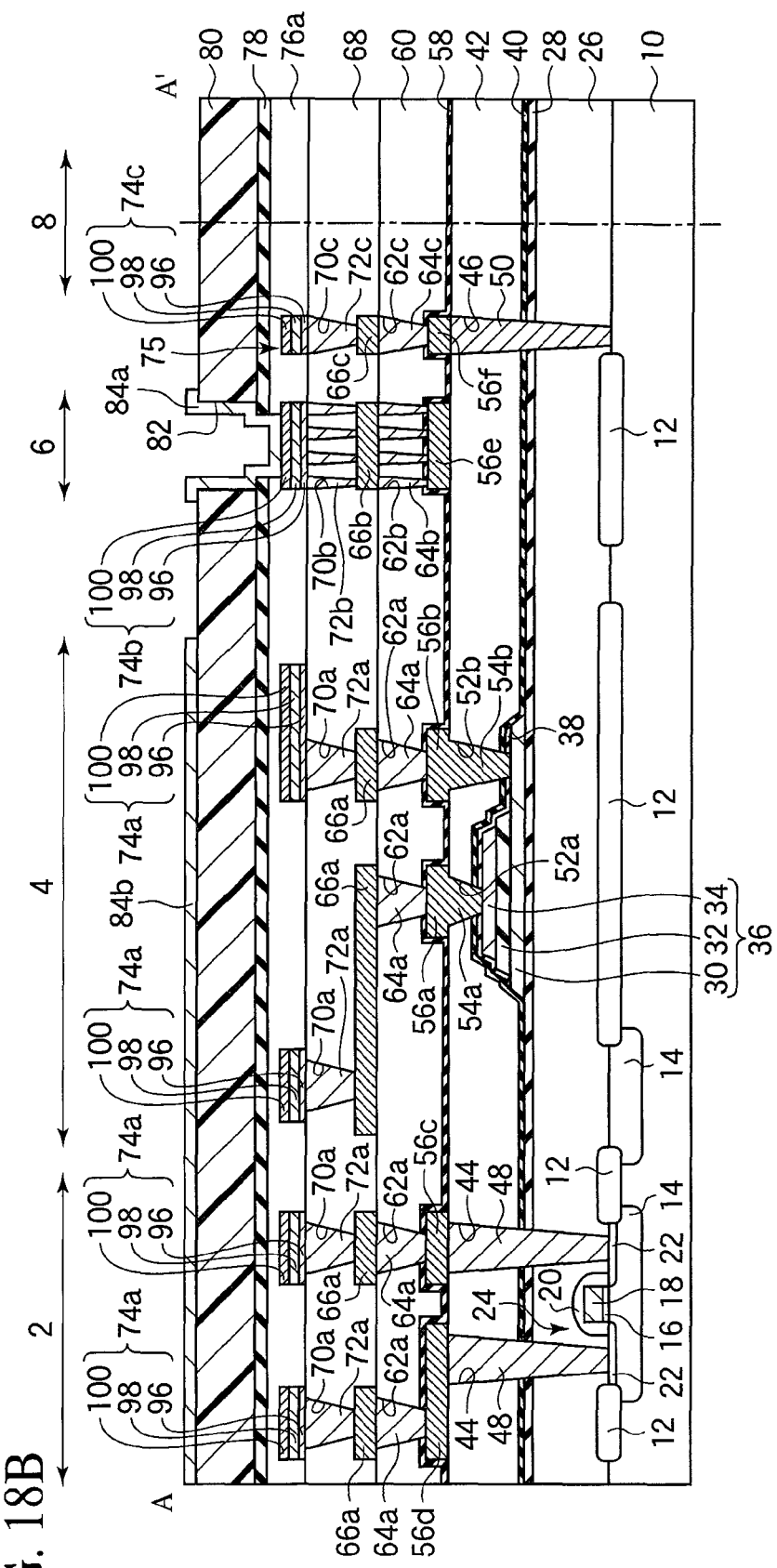

The semiconductor device according to an eighth embodiment will be explained with reference to FIGS. 18A and 18B. FIGS. 18A and 18B are a plan view and a sectional view of the semiconductor device according to the present embodiment. FIG. 18A is the plan view, and FIG. 18B is the sectional view along the A-A' line in FIG. 18A. The same members of the present embodiment as those of the semiconductor device according to the first to the seventh embodiments and the method for manufacturing the semiconductor device illustrated in FIGS. 1 to 17B are represented by the same reference numbers not to repeat or to simplify their explanation.

The semiconductor device according to the present embodiment is characterized mainly in that a protection film 78 of silicon nitride film is formed on a planarized protection film 76a, and a conducting barrier film 84b is formed, covering not only the FeRAM cell part (memory cell region) 4 but also the logic part (peripheral circuit region) 2.

As illustrated in FIGS. 18A and 18B, a conducting barrier film 84a is formed in an opening 82. On protection film 80, the conducting barrier film 84b is formed, covering not only the FeRAM cell part 4 but also the logic part 2. However, the conducting barrier film 84a formed in the opening 82 and the conducting barrier film 84b formed on the protection film 80 are isolated from each other and surely insulated from each other.

According to the present embodiment, the conducting barrier film 84b is formed wide, covering not only the FeRAM cell part 4 but also the logic part 2, whereby the arrival of hydrogen, etc. at the dielectric film 32 of the capacitors 36 may be surely prevented.

A Ninth Embodiment

Figure 19A:
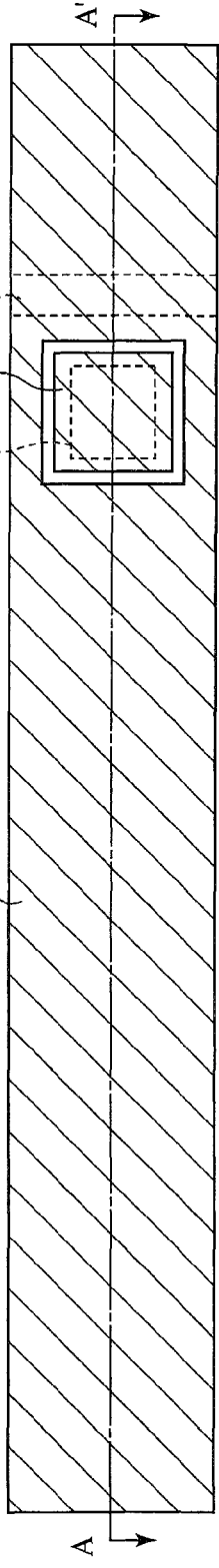
FIGS. 19A and 19B are a plan view and a sectional view of the semiconductor device according to a ninth embodiment.
Figure 19B:
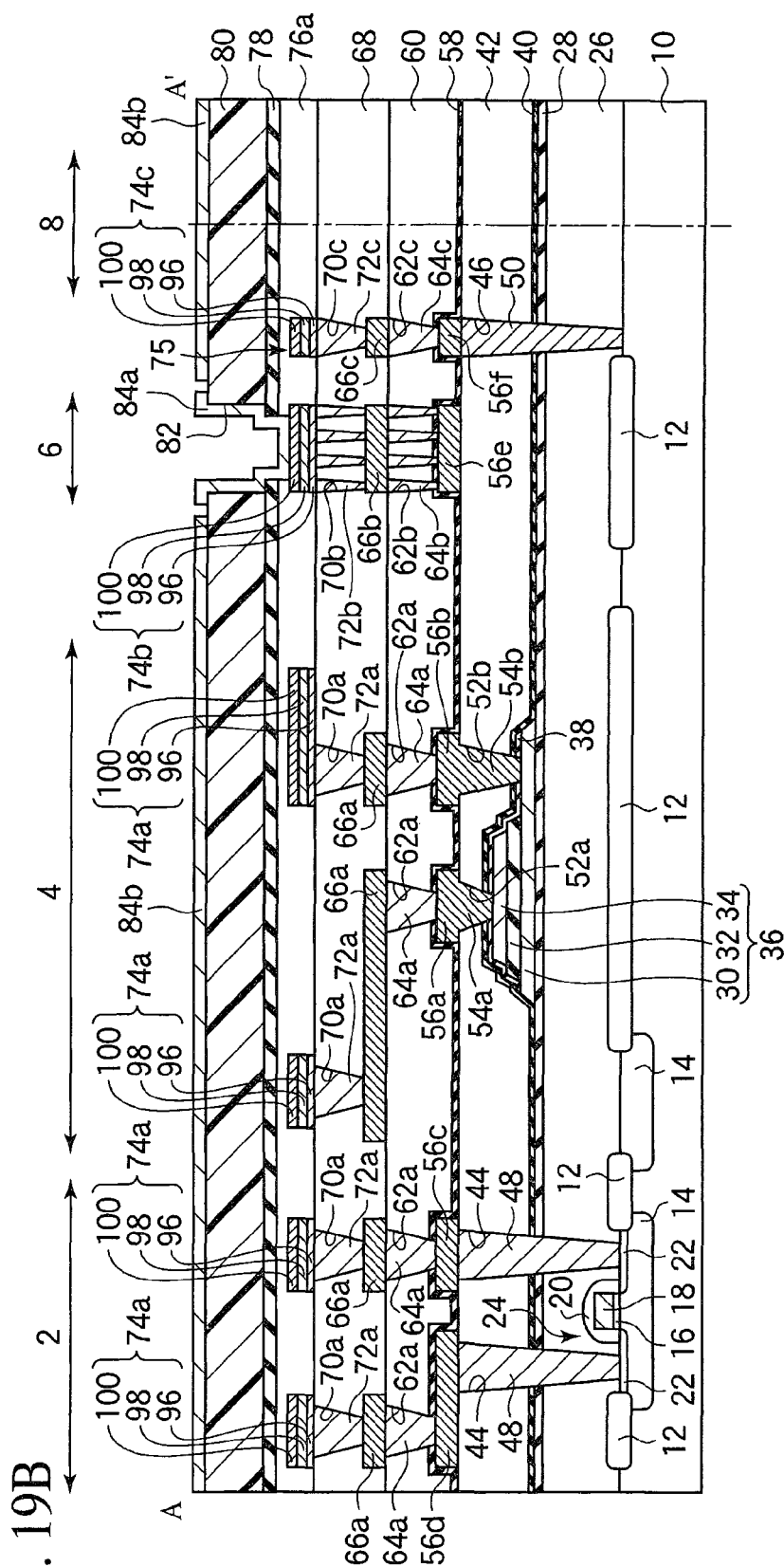

The semiconductor device according to a ninth embodiment will be explained with reference to FIGS. 19A and 19B. FIGS. 19A and 19B are a plan view and a sectional view of the semiconductor device according to the present embodiment. FIG. 19A is the plan view, and FIG. 19B is the sectional view along the A-A' line in FIG. 19A. The same members of the present embodiment as those of the semiconductor device according to the first to the eighth embodiments and the method of manufacturing the semiconductor device illustrated in FIGS. 1A to 18B are represented by the same reference numbers not to repeat or to simplify their explanation.

The semiconductor device according to the present embodiment is characterized mainly in that a protection film 78 of silicon nitride film is formed flat on a planarized protection film 78a, and a conducting barrier film 84b is formed wide in the region except the electrode pad part 6.

As illustrated in FIGS. 19A and 19B, a conducting barrier film 84a is formed in an opening 82. The conducting barrier film 84b is formed wide in the region except the electrode pad part 6. The conducting barrier film 84a formed in the electrode pad part 6 and the conducting barrier film 84b formed on the protection film 80 are formed isolated from each other and surely insulated from each other. In other words, the conducting barrier film 84b is formed, covering the whole except the region where the conducting barrier film 84a is formed.

According to the present embodiment, the conducting barrier film 84b is formed wide in the region except the electrode pad part 6, whereby the arrival of hydrogen and water at the dielectric film 32 of the capacitors 36 may be more surely prevented.

A Tenth Embodiment

Figure 20A:
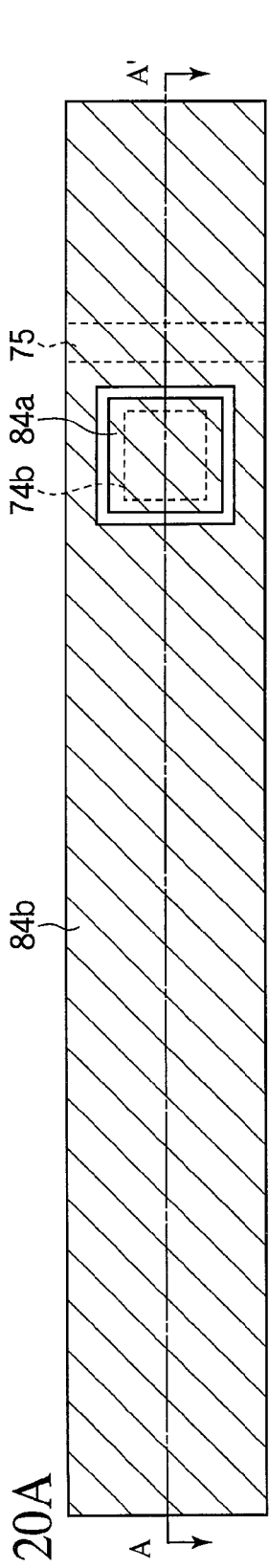
FIGS. 20A and 20B are a plan view and a sectional view of the semiconductor device according to a tenth embodiment.
Figure 20B:
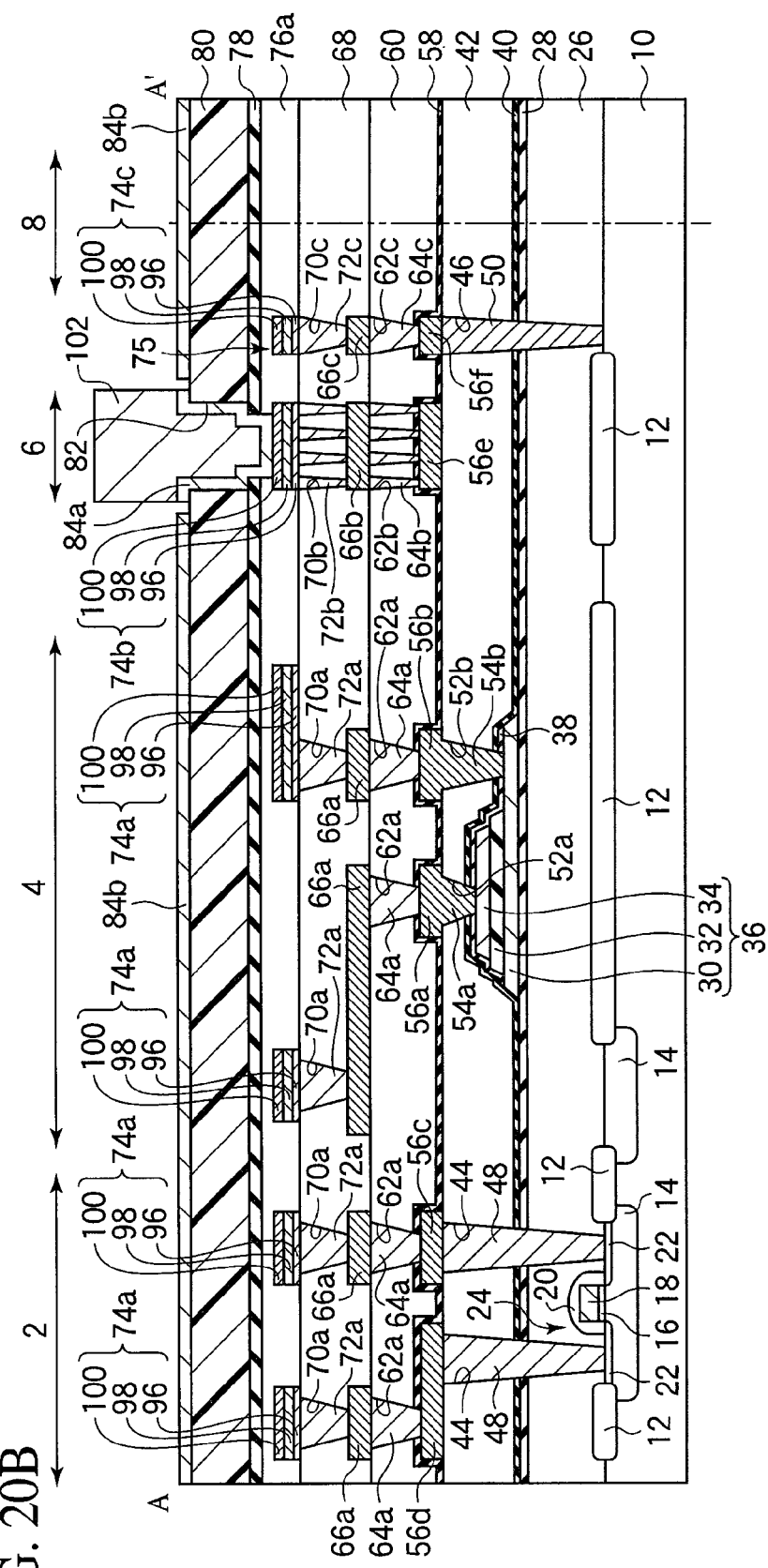

The semiconductor device according to a tenth embodiment will be explained with reference to FIGS. 20A and 20B. FIGS. 20A and 20B are a plan view and a sectional view of the semiconductor device according to the present embodiment. FIG. 20A is the plan view, and FIG. 20B is the sectional view along the A-A' line in FIG. 20A. The same members of the present embodiment as those of the semiconductor device according to the first to the ninth embodiment and the method for manufacturing the semiconductor device illustrated in FIG. 1A to 19B are represented by the same reference numbers not to repeat or to simplify their explanation.

The semiconductor device according to the present embodiment is characterized mainly in that a protection film 78 of silicon nitride film is formed flat on a planarized protection film 76a, and bump electrodes 102 are formed on a conducting barrier film 84a formed in the electrode pad part 6.

As illustrated in FIGS. 20A and 20B, the bump electrodes 102 of, e.g., gold (Au) are formed on the conducting barrier film 84a in the electrode pad part 6. The bump electrodes 102 may considerably suppress the intrusion of hydrogen and water from the outside.

According to the present embodiment, the bump electrodes 102 are further formed on the conducting barrier film 84 in the electrode pad part 6, whereby the intrusion of hydrogen and water from the outside may be more surely prevented.

An Eleventh Embodiment

The semiconductor device according to an eleventh embodiment will be explained with reference to FIGS. 21A and 21B. FIGS. 21A and 21B are a plan view and a sectional view of the semiconductor device according to the present embodiment. FIG. 21A is the plan view, and FIG. 21B is the sectional view along the A-A' line in FIG. 21B. The same members of the present embodiment as those of the semiconductor device according to the first to the tenth embodiments and the method for manufacturing the semiconductor device illustrated in FIGS. 1A to 20B are represented by the same reference numbers not to repeat or to simplify their explanation.

The semiconductor device according to the present embodiment is mainly characterized mainly in that flat insulating barrier films 104, 108, 112 are suitably formed.

As illustrated in FIGS. 21A and 21B, on an inter-layer insulation film 42 having the surface planarized, the flat insulating barrier film 104 of, e.g., a 20-80 nm-thickness aluminum oxide film is formed. The film thickness of the aluminum oxide film forming the insulating barrier film 104 is here, e.g., 50 nm. The insulating barrier film 104, which is formed on the planarized inter-layer insulation film 104, is flat. The planarized insulating barrier film 104 has good coverage, and may sufficiently prevent the diffusion of hydrogen and water.

On the insulating barrier film 104, a 100 nm-thickness silicon oxide film 106, for example, is formed. The silicon oxide film 106 is for preventing the insulating barrier film 104 from being etched in the pattering for forming interconnections 56a-56d, electrodes 56e and a metal layer 56f.

On an inter-layer insulation film 60 having the surface planarized, the flat insulating barrier film 108 of, e.g., a 20-80 nm-thickness aluminum oxide film is formed. The film thickness of the aluminum oxide film forming the insulating barrier film 108 is here, e.g., 50 nm. The insulating barrier film 108, which is formed on the planarized inter-layer insulation film 60, is flat. The flat insulating barrier film 108 has good coverage, and may sufficiently prevent the diffusion of hydrogen and water.

On the insulating barrier film 108, a 100 nm-thickness silicon oxide film 110, for example, is formed. The silicon oxide film 110 is for preventing the insulating barrier film 108 from being etched in the patterning for forming interconnections 66a, electrodes 66b and a metal layer 66c.

On the inter-layer insulation film 68 having the surface planarized, a flat insulating barrier film 112 of, e.g., a 20-80 nm-thickness aluminum oxide film is formed. The film thickness of the aluminum oxide film forming the insulating barrier film 112 is here, e.g., 50 nm. The insulating barrier film 112, which is formed on the planarized inter-layer insulation film 68, is flat. The flat insulating barrier film 112 has good coverage, and may sufficiently prevent the diffusion of hydrogen and water.

On the insulating barrier film 112, a 100 nm-thickness silicon oxide film 114, for example, is formed. The silicon oxide film 114 is for preventing the insulating barrier film 112 from being etched in the patterning for forming interconnections 74a, electrodes 74b and a metal layer 74c.

As described above, according to the present embodiment, the flat insulating barrier films 104, 108, 112 are suitably formed, whereby the arrival of hydrogen and water at the dielectric film 32 of the capacitors 36 may be surely prevented.

Modified Embodiments

The present invention is not limited to the above-described embodiments and may cover other various modifications.

For example, in the semiconductor device according to the third to the eleventh embodiments, the electrode pads 74b are formed of the layer film of the TiN film 96, the Al—Cu alloy film 98 and the magnesium alloy film 100 but may be formed of a single layer of magnesium alloy film, as are the electrode pads 74e of the semiconductor device according to the second embodiment.

In the above-described embodiments, the ferroelectric film forming the dielectric film 32 of the capacitors 36 is PZT film. However, the ferroelectric film forming the dielectric film 32 of the capacitors 36 is not limited to PZT film and can be suitably any other ferroelectric film. For example, as the ferroelectric film forming the dielectric film 32 of the capacitors 36, $Pb_{1-x}La_xZr_{1-y}Ti_yO_3$ film (PLZT film), $SrBi_2(Ta_xNb_{1-x})_2O_9$ film, $Bi_4Ti_3O_{12}$ film, etc. may be used.

In the above-described embodiments, as the dielectric film 32 of the capacitors 36, ferroelectric film is used, but the dielectric film 32 is not essentially ferroelectric film. For example, when DRAM, etc. are formed, high dielectric film may be used as the dielectric film 32. For example, (BaSr)$TiO_3$ film (BST film), $SrTiO_3$ film (STO film), $Ta_2O_5$ film, etc. may be used. The high dielectric film is dielectric film whose specific dielectric constant is higher than that of silicon dioxide.

In the above-described embodiments, as the insulating barrier films 38, 40, 104, 108, 112, aluminum oxide film is used but may not be essentially aluminum oxide film. Film having the function of preventing the diffusion of hydrogen and water may be suitably used as the insulating barrier films 38, 40, 104, 108, 112. As the insulating barrier films 38, 40, 104, 108, 112, film of, e.g., metal oxide may be suitably used. As the insulating barrier films 38, 40, 104, 108, 112 of metal oxide, tantalum oxide, titanium oxide, etc., for example, may be used. The insulating barrier films 38, 40, 104, 108, 112 are not essentially film of metal oxide. For example, silicon nitride film ($Si_3N_4$ film), silicon nitride oxide film (SiON film), etc. may be used as the barrier films 38, 40, 104, 108, 112. The film of metal oxide is dense and may surely prevent the diffusion of hydrogen and water even when formed relatively thin. In terms of the nanonization, it is advantageous to use film of metal oxide as the insulating barrier films 38, 40, 104, 108, 112.

In the above-described embodiments, as the conducting barrier films 84a, 84b, the layer films 84a, 84b of Ti film and Pd film sequentially laid is used. However, the conduction barrier films 84a, 84b may not essentially have such composition. For example, a Ti film, a TiN film and a Pd film are sequentially laid to form the conducting barrier films 84a, 84b. A Ti film, a TiAlN film and a Pd film may be sequentially laid to form the conducting barrier films 84a, 84b.

In the above-described embodiments, as the material of the interconnections 56a, 56b, etc., CuAl alloy is used, but the material of the interconnections 56a, 56b, etc. are not limited to CuAl alloy. For example, Cu may be used as the material of the interconnections 56a, 56b, etc.

In the eleventh embodiment, the flat insulating barrier films 104, 108, 112 are formed also on the respective inter-layer insulation films 42, 60, 68. However, it is not essentially necessary to form the flat insulating barrier films 104, 108, 112 on the respective inter-layer insulation films 42, 60, 68. The flat insulating barrier films 104, 108, 112 may be suitably formed as required.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor device comprising:
   a capacitor formed over a semiconductor substrate and including a lower electrode, a dielectric film formed over the lower electrode and an upper electrode formed over the dielectric film;
   an insulation film formed over the semiconductor substrate and the capacitor; and
   an electrode pad formed over the insulation film and including an alloy film of aluminum and magnesium,
   wherein a content ratio of aluminum of the alloy film of aluminum and magnesium is 1-20 weight %.

2. The semiconductor device according to claim 1, further comprising
   a first conducting barrier film formed over the electrode pad and preventing a diffusion of hydrogen or water.

3. The semiconductor substrate according to claim 2, further comprising
   a second barrier film formed above at least the capacitor and preventing a diffusion of hydrogen or water.

4. The semiconductor device according to claim 3, wherein the first conducting barrier film and the second barrier film are formed of one and the same conducting film.

5. The semiconductor device according to claim 2, further comprising
a bump electrode formed over the first conducting barrier film.

6. The semiconductor device according to claim 1, further comprising
a protection film formed over the insulation film, having an opening formed in down to the electrode pad and preventing a diffusion of water.

7. The semiconductor device according to claim 6, wherein the protection film is formed flat.

8. The semiconductor device according to claim 2, wherein the first conducting barrier film includes a Pd film.

9. The semiconductor device according to claim 3, wherein the second barrier film includes a Pd film.

10. The semiconductor device according to claim 1, wherein
the dielectric film is formed of ferromagnetic or high dielectric.

11. The semiconductor device according to claim 10, wherein
the dielectric film is $PbZr_{1-x}Ti_xO_3$ film, $Pb_{1-x}La_xZr_{1-y}Ti_yO_3$ film, $SrBi_2(Ta_xNb_{1-x})_2O_9$ film or $Bi_4Ti_2O_{12}$ film.

12. A semiconductor device comprising:
a capacitor formed over a semiconductor substrate and including a lower electrode, a dielectric film formed over the lower electrode and an upper electrode formed over the dielectric film;
an insulation film formed over the semiconductor substrate and the capacitor;
an electrode pad formed over the insulation film and including an alloy film of aluminum and magnesium; and
a first conducting barrier film formed over the electrode pad and preventing a diffusion of hydrogen or water,
wherein an outer periphery of the first conducting barrier film is larger than an outer periphery of the electrode pad.

13. The semiconductor device according to claim 3, wherein
the second barrier film is formed also above a peripheral circuit region outside a memory cell region where the capacitor is formed.

14. The semiconductor device according to claim 3, wherein
the second barrier film is formed, covering a whole surface of the insulation film except a region where the first conducting barrier film is formed.

15. A method for manufacturing a semiconductor device comprising:
forming over a semiconductor substrate a capacitor including a lower electrode, a dielectric film formed over the lower electrode, and an upper electrode formed over the dielectric film;
forming an insulation film over the semiconductor substrate and the capacitor; and
forming over the insulation film an electrode pad including an alloy film of aluminum and magnesium,
wherein a content ratio of aluminum of the alloy film of aluminum and magnesium is 1-20 weight %.

16. A method for manufacturing a semiconductor device comprising:
forming over a semiconductor substrate a capacitor including a lower electrode, a dielectric film formed over the lower electrode, and an upper electrode formed over the dielectric film;
forming an insulation film over the semiconductor substrate and the capacitor;
forming over the insulation film an electrode pad including an alloy film of aluminum and magnesium; and
contacting a probe of a test system to the electrode pad to make a test.

17. The method for manufacturing the semiconductor device according to claim 16, further comprising, after the making the test, forming over the electrode pad a conducting barrier film for preventing a diffusion of hydrogen and water.

18. The method for manufacturing the semiconductor device according to claim 17, further comprising, after the forming the barrier film, forming a bump electrode over the barrier film.

* * * * *